US007016794B2

(12) United States Patent
Schultz

(10) Patent No.: US 7,016,794 B2
(45) Date of Patent: Mar. 21, 2006

(54) FLOOR PLAN DEVELOPMENT ELECTROMIGRATION AND VOLTAGE DROP ANALYSIS TOOL

(75) Inventor: Richard T. Schultz, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 565 days.

(21) Appl. No.: 09/268,902

(22) Filed: Mar. 16, 1999

(65) Prior Publication Data

US 2003/0014201 A1 Jan. 16, 2003

(51) Int. Cl.
*G06F 9/44* (2006.01)

(52) U.S. Cl. .............................. 702/64; 702/60; 702/65; 716/8; 716/10; 716/11

(58) Field of Classification Search ............ 702/57–60, 702/65, 108, 117–121, 123–124, 182–185, 702/FOR 103–106, 111, 114, 134–135, 170–171, 702/120, 61, 62, 63, 64; 716/1, 5, 17, 8–15; 703/2, 14–16, 19; 438/599; 324/765; 29/623.1; 257/775
See application file for complete search history.

(56) References Cited

U.S. PATENT DOCUMENTS

| | | | | |
|---|---|---|---|---|
| 4,839,821 A | * | 6/1989 | Murakata ......................... 716/9 |
| 5,145,800 A | * | 9/1992 | Arai et al. .................... 438/599 |
| 5,283,753 A | * | 2/1994 | Schucker et al. ............. 716/17 |
| 5,311,443 A | * | 5/1994 | Crain et al. .................... 716/10 |
| 5,349,542 A | * | 9/1994 | Brasen et al. ................. 703/15 |
| 5,388,055 A | * | 2/1995 | Tanizawa et al. .............. 716/9 |
| 5,404,310 A | * | 4/1995 | Mitsuhashi ................... 716/13 |
| 5,410,490 A | | 4/1995 | Yastrow ....................... 364/488 |
| 5,498,767 A | * | 3/1996 | Huddleston et al. .......... 716/12 |
| 5,535,370 A | * | 7/1996 | Raman et al. ................. 703/15 |
| 5,541,849 A | * | 7/1996 | Rostoker et al. .............. 716/18 |
| 5,551,014 A | * | 8/1996 | Yoshida et al. ................ 716/11 |
| 5,557,531 A | | 9/1996 | Rostoker et al. ............. 364/489 |
| 5,598,344 A | | 1/1997 | Dangelo et al. ............. 364/489 |
| 5,598,348 A | | 1/1997 | Rusu et al. .................. 364/491 |
| 5,610,833 A | | 3/1997 | Chang et al. ................ 364/491 |
| 5,629,860 A | | 5/1997 | Jones et al. .................. 364/490 |
| 5,666,289 A | | 9/1997 | Watkins ....................... 364/491 |
| RE35,671 E | | 11/1997 | Hartoog ....................... 364/491 |

(Continued)

OTHER PUBLICATIONS

Deep Sub-micron Design Issues for a Multi-Million Transistor Microprocessor; DesignCon Conference, Jan., 1998; pp. 344-348.

*Primary Examiner*—Marc S. Hoff
*Assistant Examiner*—Jeffrey R West
(74) *Attorney, Agent, or Firm*—Christopher P. Maiorana, P.C.

(57) ABSTRACT

A method for analyzing electromigration and voltage drop effects in wire segments forming a power-bus grid of an integrated circuit. A floor plan design is created by mapping wire segments to various metal layers in the IC core. Digital, analog, and memory power zones indicating the power consumption of regions within the core are also mapped to the core. An equivalent circuit of the floor plan is generated in a netlist. The netlist is simulated, with the current density and voltage drop of power-bus wire segments calculated. Calculated current density and voltage drop values are analyzed in the floor plan design using a color map to indicate the current density and voltage drop levels of the wire segments. The designer can modify the floor plan design quickly and easily if the calculated current density and voltage drop values indicate potential electromigration or voltage drop problems.

41 Claims, 25 Drawing Sheets

U.S. PATENT DOCUMENTS

| | | |
|---|---|---|
| 5,689,432 A | 11/1997 | Blaauw et al. .............. 364/490 |
| 5,737,580 A | 4/1998 | Hathaway et al. .......... 385/500 |
| 5,757,089 A * | 5/1998 | Ishizuka .................... 307/147 |
| 5,801,959 A * | 9/1998 | Ding et al. .................... 719/11 |
| 5,812,434 A * | 9/1998 | Nagase et al. ................. 703/2 |
| 5,831,863 A * | 11/1998 | Scepanovic et al. ........... 716/9 |
| 5,872,952 A * | 2/1999 | Tuan et al. ................... 703/14 |
| 5,878,053 A | 3/1999 | Koh et al. |
| 5,914,889 A * | 6/1999 | Cohen et al. ................. 716/8 |
| 5,923,089 A * | 7/1999 | Yao et al. .................... 257/775 |
| 5,933,358 A | 8/1999 | Koh et al. |
| 6,028,440 A * | 2/2000 | Roethig et al. ............. 324/765 |
| 6,185,722 B1 * | 2/2001 | Darden et al. .................. 716/5 |
| 6,202,191 B1 * | 3/2001 | Filippi et al. .................. 716/5 |
| 6,223,328 B1 * | 4/2001 | Ito et al. ........................ 716/6 |
| 6,247,162 B1 | 6/2001 | Fujine et al. |
| 6,260,184 B1 * | 7/2001 | Brennan et al. .............. 716/14 |
| 2001/0049813 A1 * | 12/2001 | Chan et al. .................... 716/8 |

* cited by examiner

Enter Design Information

Technology ○ custom ● c9 ○ c10

Supply Voltage ○ 1.8 ○ 2.5 ● 3.3

Core Size X-dimension(um) [4000]

Core Size Y-dimension(um) [4000]

Cancel/Close    Enter

*Fig. 7*

Design Information

| | |
|---|---|
| Technology | c9 |
| Metal 1 Sheet Rho (ohms/square) | 0.042 |
| Metal 2 Sheet Rho (ohms/square) | 0.05 |
| Metal 3 Sheet Rho (ohms/square) | 0.05 |
| Metal 4 Sheet Rho (ohms/square) | 0.05 |
| Metal 5 Sheet Rho (ohms/square) | 0.05 |
| Metal 1 Cell Height (um) | 34 |
| Metal 1 Cell Row Width (um) | 3.6 |
| Pad Cell Width (um) | 70 |
| Pad Cell Height (um) | 125 |
| Supply Voltage (volts) | 3.3 |

Accept Technology Info

*Fig. 8*

Enter Core Bus Information

Core Ring Metal Layer ○ m1 ○ m2 ● m3 ○ m4 ○ m5

Vertical/Horizontal (v,h) ○ v ● h

Center Coordinate(um) [0]

Start Coordinate(um) [0]

Stop Coordinate(um) [4000]

Strap Witdh(um) [75]

Cancel/Close    Undo   Enter

*Fig. 9*

| | |
|---|---|
| Enter Vigen Information | |
| Vigen Current (mA) | 0 |
| Vigen Vertical/Horizontal(v, h) | ◆ v ◇ h |
| Vigen Center Coordinate(um) | 1000 |
| Vigen Start Coordinate(um) | 0 |
| Vigen Stop Coordinate(um) | 2000 |
| Vigen Width(um) | 2000 |
| Vigen Bus Vertical/Horizontal (v/h) | ◆ v ◇ h |
| Vigen Current Location (start/stop) | ◆ start ◇ stop |
| Vigen Bus Center Coordinate (um) | 1900 |
| Vigen Bus Start Coordinate (um) | 0 |
| Vigen Bus Stop Coordinate (um) | 2000 |
| Vigen Bus Width(um) | 30 |
| Cancel/Close | Undo    Enter |

*Fig. 12*

Enter Custom Bus Information

| | |
|---|---|
| Custom Bus Metal Layer | ⌄ m1  ● m2  ⌄ m3  ⌄ m4  ⌄ m5 |
| Vertical/Horizontal(v, h) | ● v  ⌄ h |
| Center Coordinate(um) | 1000 |
| Start Coordinate(um) | 0 |
| Stop Coordinate(um) | 2000 |
| Strap Witdh(um) | 20 |
| Cancel/Close | Undo  Enter |

Run Spice

Spice Input File Name    esatdemo.sp

Spice Output List File Name    esatdemo.lis

Cancel/Close                    Enter

*Fig. 28*

Load Design

Spice Output List File Name to Load    esatdemo.lis

Cross Reference File Name to Load    esatdemo.xrf

Cancel/Close                    Enter

*Fig. 29*

Activate Layers

Vigen Cells On    n ◆ y
Analog On    n ◆ y
Core Ring On    n ◆ y
Pad Cells On    n ◆ y
M1 Core Straps On    n ◆ y
M2 Core Straps On    n ◆ y
M3 Core Straps On    n ◆ y
M4 Core Straps On    n ◆ y
M5 Core Straps On    n ◆ y
Power Zone On    n ◆ y Cancel/Close    Enter

*Fig. 32*

Set Color Map

Red Level (mA/um)   1
Orange Level (mA/um)   0.8
Yellow Level (mA/um)   0.4
Green Level (mA/um)   0.2
Blue Level (mA/um)   0.1
Purple Level (mA/um)   0.05
Black Level (mA/um)   0.025

Cancel/Close    Enter

*Fig. 33*

Set Color Map

Red Level (volts)   3.0
Orange Level (volts)   3.05
Yellow Level (volts)   3.1
Green Level (volts)   3.15
Blue Level (volts)   3.2
Purple Level (volts)   3.25
Black Level (volts)   3.3

Cancel/Close    Enter

*Fig. 34*

FLOOR PLAN DEVELOPMENT ELECTROMIGRATION AND VOLTAGE DROP ANALYSIS TOOL

BACKGROUND OF THE INVENTION

1. Field of the Invention

This invention relates to the design of integrated circuits, and more particularly to the design and analysis of an integrated circuit floor plan.

2. Description of Related Art

Microelectronic integrated circuits (ICs), such as computer chips, are used in a variety of products including personal computers, automobiles, communication systems, and consumer electronics products. As modern day ICs become increasingly more powerful, their internal circuitry become increasingly more complex. A present day IC usually contains millions of microscopic circuit structures such as transistors, resistors, and capacitors on a small silicon die or core. Typically, the entire silicon core is encapsulated in plastic or ceramic, with a number of lead pins exposed to the outside world.

Power is generally supplied to the IC through one or more of these lead pins. Bond wires typically conduct the power from the lead pins to power pad cells located on the core. The power pad cells connect to a power-bus grid comprising of thin metal wires which route power to IC structures throughout the core. A power-bus grid is typically constructed on several vertical layers, with the number of layers dependent on the IC fabrication technology used. All the power-bus wires are generally routed running parallel to either the width (horizontally-oriented wires) or the length (vertically-oriented wires) of the core. Power-bus layers are usually named Metal 1, Metal 2, Metal 3, and so on, with Metal 2 located above Metal 1, Metal 3 located above Metal 2, and so on. Generally, each layer is connected to the layer immediately above it by metal plugs or vias which run between intersecting wire lines. The power-bus grid is typically connected to the rest of the IC structures with plugs or contacts running from the Metal 1 bus lines to the IC transistors.

One of the main factors helping to increase the performance and complexity of modern ICs is the use of Computer-Aided Design (CAD) tools during the IC design process. In addition to simplifying the design process, CAD tools can help speed up the development time of an IC by automating much of the design process. This decreases the time and cost necessary to develop an IC and helps the designer create more competitive products in the market.

A typical IC design process begins with a design specification. The specification is set by the goals and limitations of the design project. For example, a design application specified for use in a portable device may require the IC to operate using a low voltage power supply. Generally, the specification helps the designer determine the IC fabrication technology, supply voltage, and core size needed to implement the design.

Next, an abstract representation of the circuit is created by the designer. Circuit abstraction helps the designer focus on the behavioral aspects of the design without having to worry about low-level circuit theory and device physics details. Designers typically work in a top-down methodology, starting with a behavioral description and working down to more detailed register, gate, and switch levels of abstraction. Designers generally use a Hardware Description Language (HDL) such as VHDL to abstract the circuitry of an IC. HDL is similar to a high level programming language and typically includes libraries containing a set of circuit components supported by the targeted fabrication process. This helps ensure the HDL code written can be converted to a real-life product.

The abstracted code is generally converted into a database listing or a circuit netlist. A netlist is typically a list of individual circuit components with a description of the connections between their inputs and outputs. Since the netlist is produced from a behavioral description of the circuitry, it does not include information relating to the physical position of the circuit structures in the circuit. Therefore, information such as the distance of power-bus wires connecting to the circuit structures is usually not contained in the netlist.

The netlist is generally input to a simulator which performs a pre-layout simulation of the circuit design. Simulation permits the designer to test whether a particular design works before it is built. By using mathematical models for physical devices, a simulator can provide simulated output results for circuit designs. By comparing the simulation results with the expected simulation output, the designer can make sure the design works before actually building the IC. If the simulation results do not conform to the original design objectives, the designer can return to the HDL code and adjust the design accordingly. The designer may also use a simulator to compare several design approaches to each other and find the most favorable design approach.

Since the physical layout of the circuit is not specified in the netlist, ideal power-bus grid wires are typically assumed during the pre-layout simulation. Thus, the resistance of the wires supplying current to the IC is generally not taken into account by the simulator. Although the pre-layout simulation tests the circuit's operation in ideal, rather than real-life conditions, the simulation results are still useful as an initial test of the circuit's operation.

When the designer is satisfied with the pre-layout simulation results, it is time to layout the design physically on the IC silicon core. Layout tools help the designer map the individual circuit structures to physical locations on the IC core. In addition, layout tools help route a power-bus grid which supplies power to the IC core. Layout tools typically contain libraries with information regarding the physical and geometrical properties of the circuit structures created during the fabrication process. Using place-and-route algorithms, the layout tools "seed" the circuit structures along the power-bus grid.

Once the IC layout is completed, the layout tools back-annotate the original netlist with additional structural data such as parasitic resistance and capacitance values, as well as power-bus wire resistance parameters. The back-annotated netlist is then run through a post-layout simulation to ensure proper functionality. Post-layout simulation is expected to represent the IC's true performance, rigorously testing the actual loading of the circuits and power-bus lines. Post-layout simulation usually requires a long time to complete, typically taking several days to finish. Results from this simulation can reveal problems such as excessive power-bus voltage drop and electromigration, which are generally not discoverable during pre-layout simulation.

Voltage drop problems are a result of a large drop in voltage across a wire conducting an electric current. The amount of voltage drop across a wire is proportional to the amount of current the wire is conducting and the wire's internal resistance. One factor affecting a wire's resistance is its cross-sectional area. As the cross-sectional area of a wire is made smaller, the wire's resistance increases, causing a larger drop in voltage. A large voltage drop across a power-bus wire can cause a lower than desired level of voltage at a particular point in the IC. When this low voltage is used to supply power to a transistor, the transistor's output response time to a change in input signal generally slows down. This skews circuit timings and may lead to IC malfunctions if time critical operations are not performed when expected. If the voltage drop across the power-bus wire is even more severe, the logic errors may occur and the entire IC may not operate as expected.

Electromigration is caused when electrons flowing through a wire randomly collide into the atoms of the wire, "carrying" the atoms along their path and causing wire deterioration, much like ocean currents carry beach sand and cause beach erosion. Electromigration is generally most pronounced in thin wires with a relatively large amount of current flow (high current density). Electromigration causes a gradual thinning out of the wire, thereby exacerbating the electromigration problem even more and creating a positive feedback effect. Electromigration typically leads to voltage drop across a wire, and eventually to a break in the wire.

One drawback of discovering voltage drop and electromigration problems after post-layout simulation relates to the amount of time required for the simulation to complete. There are often strong market pressures to design and manufacture a new IC in a very short time. Finding voltage drop and electromigration problems after post-layout simulation requires the designer to change the IC floor plan and re-run the layout and simulation tools. Such problems may add days, if not weeks to the design cycle time and can significantly decrease a product's competitive advantage. In addition, the post-layout simulation time makes testing and comparing several different power-bus grid designs extremely time consuming.

One solution in the prior art of avoiding voltage drop and electromigration problems is to use very conservative power estimates when designing the power-bus grid. Designers typically multiply the amount of current estimated to flow through the power-bus grid by a cushioning factor to avoid voltage drop and electromigration problems. These conservative estimates generally result in power-bus wire widths which are significantly thicker than actually necessary to supply power throughout the IC core.

A drawback of over-estimating circuit power requirements is a sub-optimal use of the IC's available silicon space. Since each component and wire within an IC takes up room on the silicon core, IC designers typically try to decrease the size of these components and wires so that ever more powerful circuits can be constructed in the IC core. Having more room on the IC core allows designers to add more circuit components and increase the IC's functionality. Thus, power-bus wires designed thicker than actually needed tend to waste valuable room on the IC.

It is against this back ground and the problems of the prior art that the present invention has been developed, as described in more detail below.

SUMMARY OF THE INVENTION

In light of the above and according to a broad aspect of the invention, a method for analyzing an electrical characteristic of wire segments forming a power-bus grid in an integrated circuit core is disclosed. The method includes mapping the power-bus grid to the integrated circuit core, specifying at least one power zone in the integrated circuit core, calculating an electrical characteristic of the wire segments relating to the current flowing there through, and displaying the calculated electrical characteristic in the wire segments.

The calculated electrical characteristic of the wire segments may be the current density of the wire segments. The calculated electrical characteristic of the wire segments may also be the voltage drop of the wire segments. The method may include abstracting a circuit design receiving power from the power-bus grid and generating a netlist of the circuit design. The operation of generating a netlist of the circuit design may be completed after the operation of displaying the calculated electrical characteristic in the wire segments.

The present invention also relates to a method for analyzing current density in wire segments forming a power-bus grid in an integrated circuit core. The method includes mapping the power-bus grid to the integrated circuit core, specifying at least one power zone in the integrated circuit core, calculating a current density in the wire segments with respect to the power zone, and displaying the calculated current density in the wire segments.

The operation of calculating a current density may further include generating an equivalent circuit of the wire segments and the power zone, simulating the equivalent circuit, and generating a representation of the current density of the equivalent circuit. The equivalent circuit can be a SPICE netlist. The operation of displaying a current density may further include defining one or more current density threshold values, and indicating when the current density exceeds the threshold values. The operation of indicating when the current density exceeds the threshold values can include matching the threshold values with colors, and displaying the power-bus grid in the colors matched to the threshold values.

The operation of mapping the power-bus grid may further include specifying a length and a width of the core, a length and a width of the wire segments, a vertical layer for the wire segments, and a sheet resistance of the wire segments. The power zone can include a memory block, a digital block, an analog block, and a pad cell block.

The present invention also relates to a method for analyzing voltage drop in wire segments forming a power-bus grid in an integrated circuit core. The method includes mapping the power-bus grid to the integrated circuit core, specifying at least one power zone in the integrated circuit core, calculating a voltage drop in the wire segments with respect to the power zone, and displaying the calculated voltage drop in the wire segments.

The present invention also relates to a program storage medium, readable by a computer, tangibly embodying a program of instructions executable by the computer for analyzing electrical characteristic in wire segments forming a power-bus grid in an integrated circuit core. The program includes instructions for mapping the power-bus grid to the integrated circuit core, specifying at least one power zone in the integrated circuit core, calculating an electrical characteristic of the wire segments relating to the current flowing there through, and displaying the calculated electrical characteristic in the wire segments.

The calculated electrical characteristic of the wire segments can be a calculated current density of the wire segments. The calculated electrical characteristic of the wire segments can also be a calculated voltage drop of the wire segments.

The foregoing and other features, utilities, and advantages of the invention will be apparent from the following more particular description of the preferred embodiment of the invention as illustrated in the accompanying drawings and as defined by the appended claims.

BRIEF DESCRIPTION OF THE DRAWINGS

FIG. 7 depicts a design information dialog box.

FIG. 8 shows a custom design technology dialog box.

FIG. 9 shows a core bus dialog box.

FIG. 12 shows a Vigen power zone dialog box.

FIG. 28 shows a run SPICE dialog box.

FIG. 29 shows a dialog box for loading SPICE simulation output results.

FIG. 32 shows an activate layers dialog box.

FIG. 33 shows a set color map dialog box for current density range values.

FIG. 34 shows a dialog box for voltage drop range values.

DETAILED DESCRIPTION OF THE INVENTION

Figure 1:
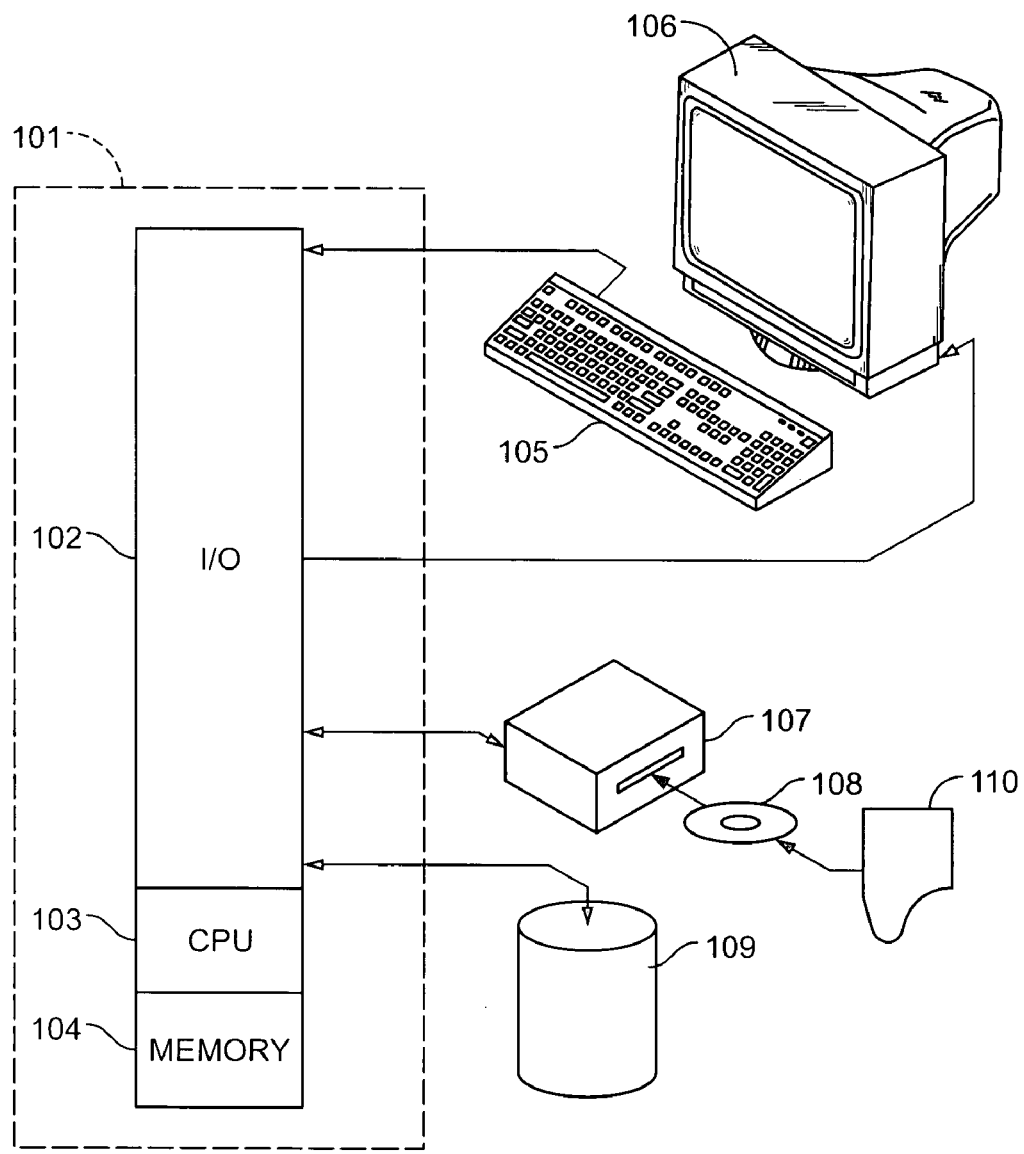
FIG. 1 depicts a general purpose computer in accordance with the present invention.

One operating environment in which the present invention is potentially useful encompasses the general purpose computer. In such a system, data and program files may be input to the computer, which reads the files and executes the programs therein. Some of the elements of a general purpose computer are shown in FIG. 1, wherein a processor 101 is shown having an input/output (I/O) section 102, a Central Processing Unit (CPU) 103, and a memory section 104. The present invention is optionally implemented in software devices loaded in memory section 104 and/or stored on a configured CD-ROM 108 or storage unit 109 thereby transforming the computer system in FIG. 1 to a special purpose machine for implementing the present invention.

The I/O section 102 is connected to a keyboard 105, a display unit 106, a disk storage unit 109, and a disk drive unit 107. Generally, in contemporary systems, the disk drive unit 107 is a CD-ROM driver unit capable of reading a CD-ROM medium 108, which typically contains programs 110 and data. Computer program products containing mechanisms to effectuate the apparatus and methods in accordance with the present invention may reside in the memory section 104, on a disk storage unit 109, or on the CD-ROM medium 108 of such a system. Alternatively, disk drive unit 107 may be replaced by a floppy drive unit, a tape drive unit, or other storage medium drive unit (none of which are shown). Examples of such systems include SPARC systems offered by Sun Microsystems, Inc., personal computers offered by IBM Corporation and by other manufacturers of IBM-compatible personal computers, and other systems running a UNIX-based or other operating system. In accordance with the present invention, simulator, verification, and extraction modules may be executed by the CPU 103, and simulation output, input stimulus, mask generation file, and other data may be stored on a disk storage unit 109, a disk drive unit 107, or other storage medium drive units coupled to the system.

Figure 2:
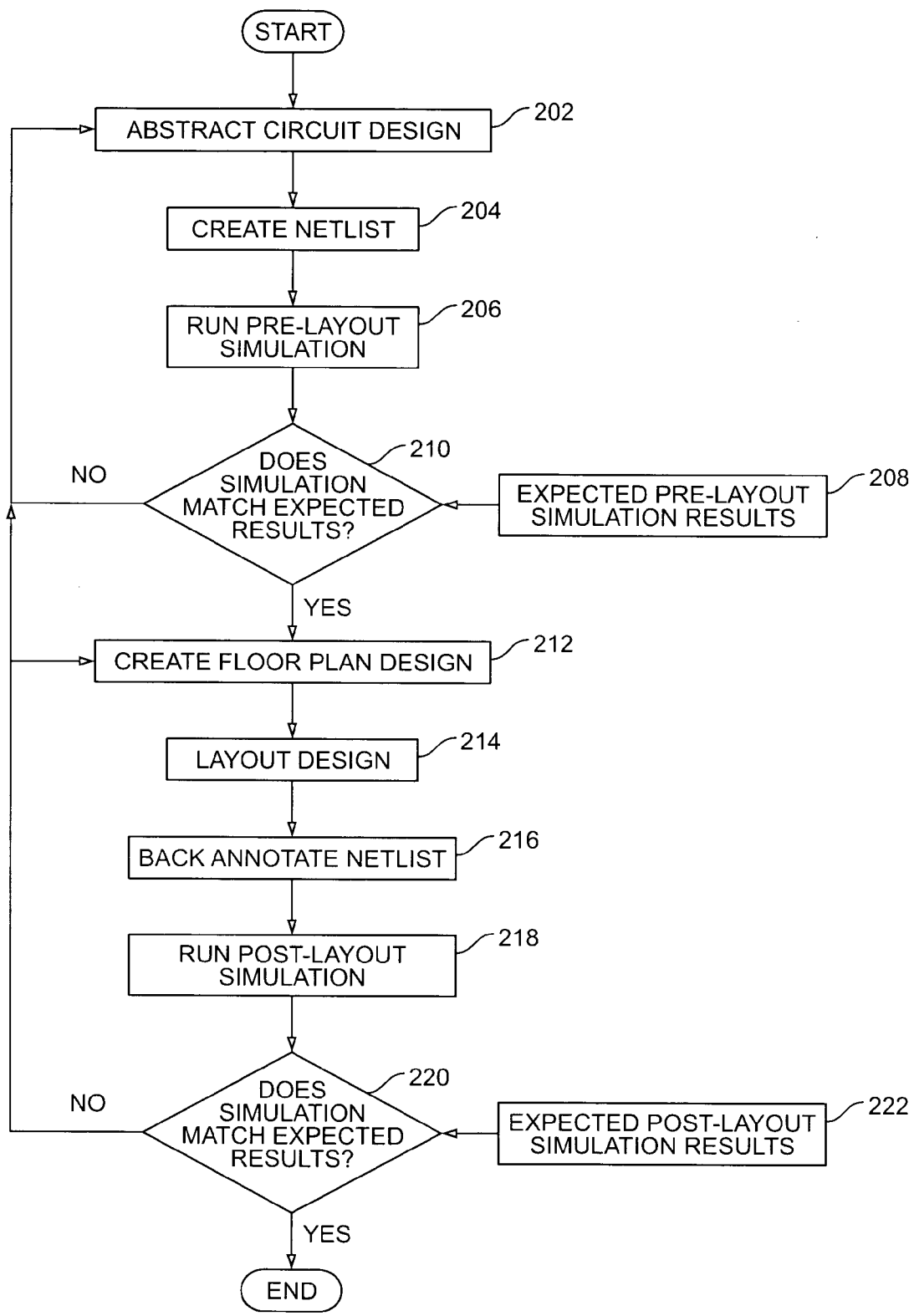
FIG. 2 is a flow chart illustrating a method for mapping integrated circuit structures of a circuit design and a power-bus grid to an integrated circuit core, as contemplated by the present invention.

FIG. 2 is a flow diagram illustrating a method of the present invention for mapping IC structures and a power-bus grid to an IC's core. At step 202, the designer creates a representation of the circuit to be implemented as an IC. The circuit representation is preferably written in HDL, however other forms of circuit abstraction known in the art are contemplated by the present invention. For example, the designer may employ a schematic representation of the circuit which uses graphical symbols to define various IC structures.

Next, at step 204, the design representation is converted into a netlist description. It is contemplated by the present invention that the design representation can be converted to other database format descriptions used by circuit simulation tools known in the art.

After the circuit netlist is generated, the netlist description is simulated at step 206. The designer usually specifies stimulus conditions to drive specific functional aspects of the circuit during simulation. The stimulus conditions typically match anticipated real-world conditions, helping predict the circuit's performance in its true working environment. Nevertheless, since very little placement information is yet known about the design, pre-layout simulation does not simulate power-bus voltage drop or electromigration performance.

At step 208, the expected pre-layout results are determined by the designer and typically match the design specifications the circuit is based on. At step 210, the designer compares the pre-layout simulation results from step 206 to expected pre-layout simulation results from step 208. If the designer determines that the simulation results do not match the expected simulation results, he or she may return to previous design flow steps until satisfactory results are achieved. For example, the designer may change the circuit HDL code, modify the expected results, or change the input stimulus used during pre-layout simulation.

When the designer is satisfied with the pre-layout simulation results, an IC floor plan is created at step 212. During this step, the designer creates a power-bus grid which is mapped to the IC core. In addition, voltage drop and electromigration tests are performed on the power-bus grid, and the designer can quickly and easily modify the power-bus grid to correct for voltage drop and electromigration problems without running a post-layout simulation of the circuit. The designer can also use this step to optimize the power-bus wire widths and allow for more circuit structures to be placed on the IC core. Several power-bus grid designs may be compared to one another during this step, helping the designer find the best power-bus grid design.

At step 214, the floor plan and power-bus grid information is used to map the remaining circuit structures throughout the silicon core. Transistors, resistors, capacitors, and other IC structures known in the art are mapped to the core and routed to the power-bus grid where necessary. Once the entire circuitry is mapped to the IC core, step 216 back annotates the original netlist with the layout information. In this manner, the netlist contains a concise representation of the IC's electrical structure which can be used to accurately predict the IC's behavior once it is physically constructed.

The annotated netlist is then simulated at step 218 to make sure the IC will function as expected before it is physically fabricated. Once again, the design must create stimulus conditions to drive specific functional aspects of the circuit during simulation. The stimulus conditions can either be the same ones used during pre-layout simulation, or different conditions specifically tailored for post-layout simulation. The post-layout simulation typically takes much longer to complete than the pre-layout simulation.

At step 220, the post-layout simulation results are compared to the expected post-layout simulation results created by the designer in step 222. If the designer is not satisfied with the post-layout results, he or she can return to previous steps in the design process and modify the design accordingly. If the designer obtains favorable post-layout simulation results which meet the design specification, the IC design can be transferred to a manufacturer who can then fabricate the IC.

Figure 3:
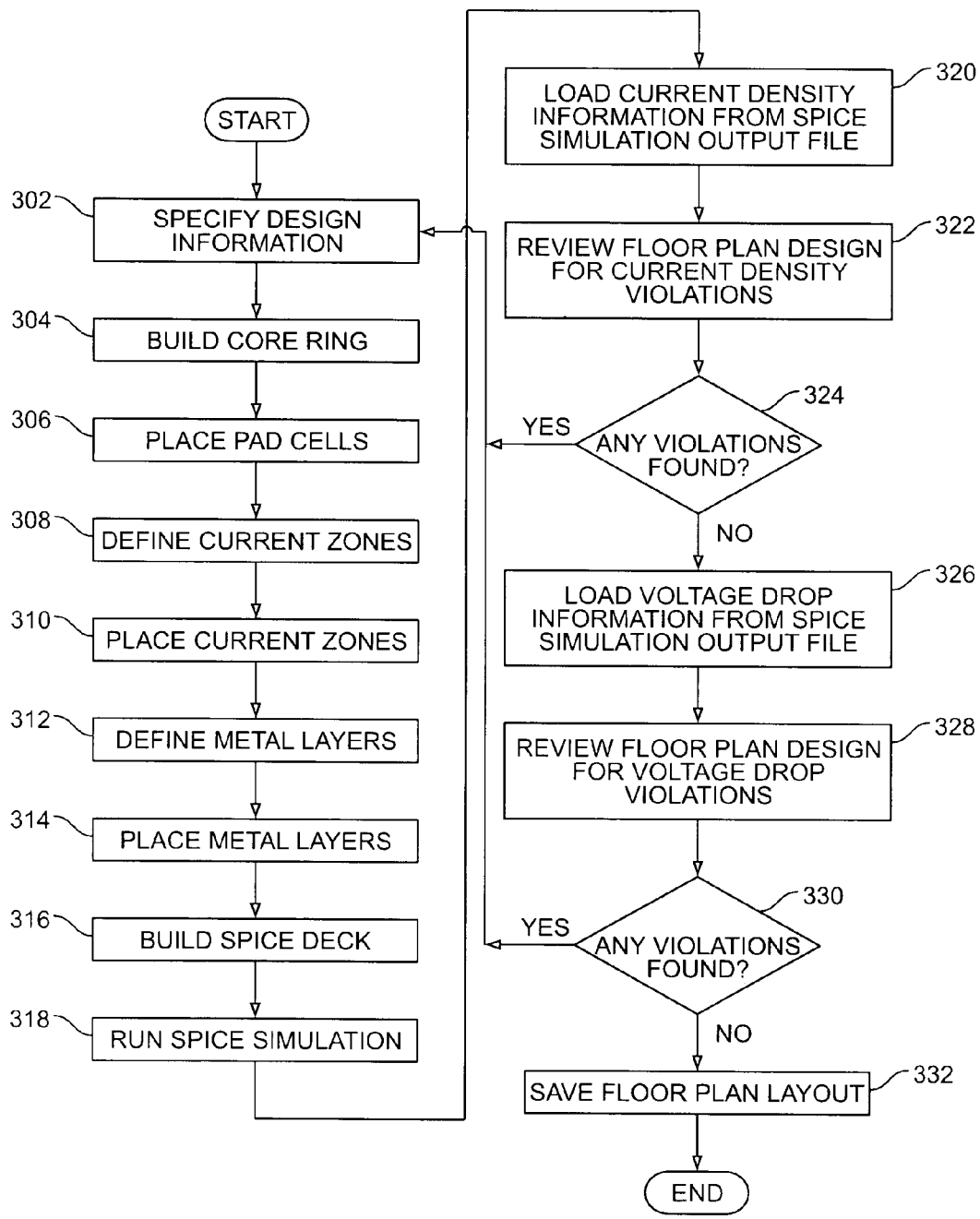
FIG. 3 is a flowchart diagram further detailing step 212 of FIG. 2 and illustrating an alternate embodiment of the present invention.

FIG. 3 is a flowchart diagram further detailing step 212 of FIG. 2 and illustrating an alternate embodiment of the present invention. At step 302, the designer enters general design information about the IC. During this step, the designer specifies the silicon core dimensions, the power supply voltage, and a fabrication technology. The fabrication technology controls such process parameters as the physical power pad cell dimensions and the metal layer sheet resistance values for each metal layer.

At step 304, the designer creates a core ring. The core ring is usually a thick metal wire loop running along the periphery of the core. Generally, the core ring is the starting point of the power-bus grid and makes contact with the power pads. The horizontal and vertical wire segments of the core ring are typically mapped to different metal layers and connected by vias at their intersections.

At step 306, the designer maps power pad cells on the core. The location of the pad cells usually depends on the position of the lead pins. Generally, lead pins are located on the sides of the chip, requiring the pad cells to be mapped along the core perimeter. Newer flip-chip technologies, however, place lead pins on the top of a chip, and allow pads to be mapped in the interior of the core.

At steps 308 and 310, the designer creates and maps power zones throughout the core floor plan. Current zones are used to designate the current consumption of various physical locations in the core. For example, a region containing a large memory array structure, also referred to as a Vigen, may consume more power than a region containing a sparse amount of digital cells. The designer specifies the size and location of the power zones, and can also specify whether a power zone occupies an area prohibiting Metal 1 wires from automatically being seeded inside. Generally, a Vigen block contains its own predefined power-bus grid which is connected to the IC's power-bus grid. The Vigen therefore does not require Metal 1 power lines to be automatically placed throughout its array.

The designer uses power zones to indicate which areas of the core draw more or less current. The designer can indicate both the average and peak current values of the zone. Average current is used to calculate current density and peak current is used to calculate voltage drop, as further described below.

Next, at steps 312 and 314, additional power-bus wires are added to the core, completing the IC power-bus grid. The designer specifies the length, width, orientation (horizontal or vertical), and layer of each wire segment mapped to the core. Alternatively, the designer can map wire segments automatically throughout a particular layer.

Once the designer has completed the power-bus grid, a netlist is generated at step 316. The netlist is an equivalent circuit of the floor plan design comprising a resistor mesh array representing the power-bus grid, and current sources representing the power zones.

Figure 4:
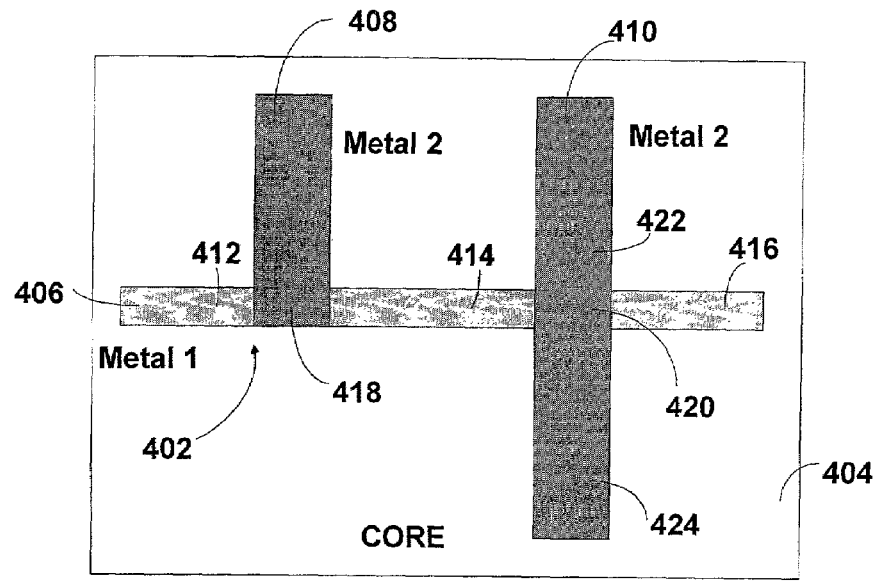
FIG. 4 depicts a top-view of a simplified floor plan design.

For example, FIG. 4 depicts a top-view of a simplified floor plan design comprising a power-bus grid 402. A core 404 contains a horizontally-oriented Metal 1 bus line 406 which intersects two vertically-oriented Metal 2 bus lines 408 and 410. The Metal 1 bus is divided into an right wire segment 416, a middle wire segment 414, and a left wire segment 412 by a first Metal 2 bus 408 and a second Metal 2 bus 410. A via or vias (not shown) connect the first Metal 2 bus 408 to the Metal 1 bus 406 at an overlap region 418. Likewise, the second Metal 2 bus 410 connects to the Metal 1 bus 406 at overlap region 420, dividing the Metal 2 bus 410 into an top segment 422 and a bottom segment 424.

Figure 5:
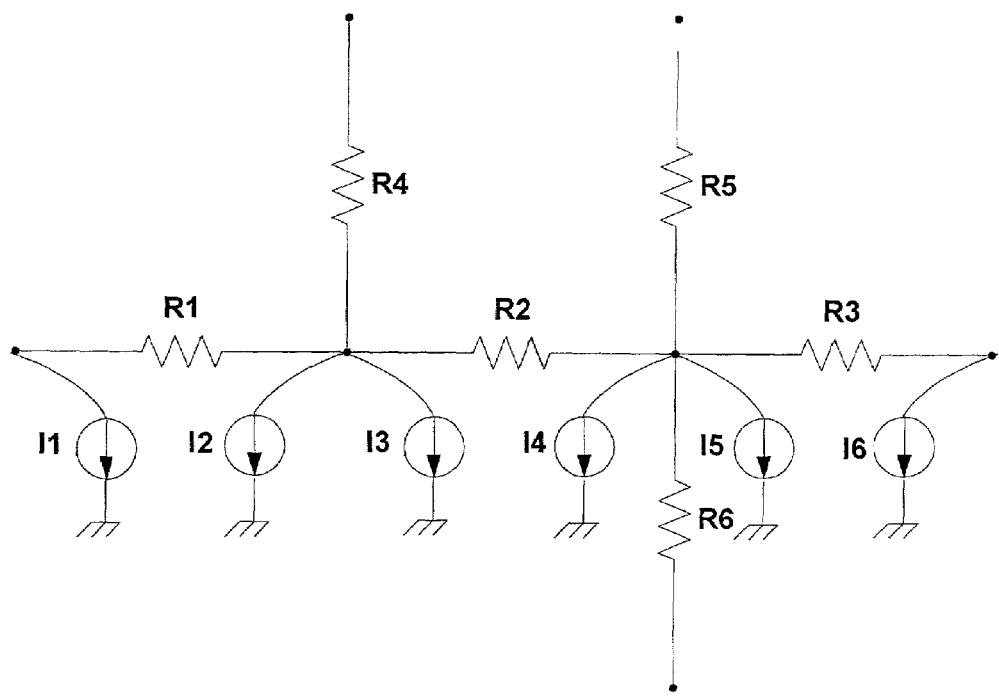
FIG. 5 shows an equivalent circuit schematic of the floor plan design in FIG. 4.

FIG. 5 shows an equivalent circuit schematic of the floor plan in FIG. 4. Resistors R1, R2, and R3 are an equivalent circuit representation of the FIG. 4 Metal 1 right wire segment 416, middle wire segment 414, and left wire segment 412 respectively. The resistance of each metal wire segment making up a power-bus grid can be defined by the equation:

$$M_{resistance} = M_{rsheet} \times \frac{M_{length}}{M_{width}}$$

where $M_{resistance}$ is the resistance of the metal wire segment, $M_{rsheet}$ is the metal segment's sheet resistance, $M_{length}$ is the metal segment's length, and $M_{width}$ is the metal segment's width. The sheet resistance of a wire segment is generally measured in Ohms per square and is dependent on the particular fabrication technology used. Via resistance can also be calculated in a similar manner. Resistor R4 of FIG. 5 represents the first Metal 2 bus 408 of FIG. 4, and resistors R5 and R6 of FIG. 5 represent the top and bottom Metal 2 segments 422 and 424 of FIG. 4.

In FIG. 5, power zones are represented by current sources located at Metal 1 and Metal 2 intersections. Current sources are generally placed at Metal 1 and Metal 2 intersections, with the amount of current passing through the current source to ground expressed as follows:

$$I_{M1segment} = \frac{I_{zone}}{L_{M1zone}} \times L_{M1segment}$$

where $I_{M1segment}$ is the current passing through the current source, $I_{zone}$ is the current used by the power zone, $L_{M1zone}$ is the total length of Metal 1 layer wire in the power zone, and $L_{M1segment}$ is the length of the Metal 1 segment connecting to the current source.

Assuming the floor plan of FIG. 4 is enclosed in a power zone, current sources I1 and I2 of FIG. 5 represent the current passing through the Metal 1 left wire segment 412 of FIG. 4 to connected IC structures. The total current passing through the left Metal 1 wire segment 412 of FIG. 4 is distributed to both ends of the wire segment. Thus, the total current is divided in half and placed at current sources I1 and I2 of FIG. 5. Similarly, current sources I3 and I4 of FIG. 5 represent the current passing through the middle Metal 1 wire segment 414 of FIG. 4, and current sources I5 and I6 of FIG. 5 represent the current passing through the right Metal 1 wire segment 416 of FIG. 4.

Returning now to FIG. 3, at step 318 the netlist is simulated, with current density and voltage drop values at each netlist node returned. Preferably, the simulator tool used is a SPICE simulator, however other simulators know in the art are also contemplated by the present invention. Current density and voltage drop nodal values can be can be calculated by the following equations:

$$V_{Msegment} = \text{peak}(I_{Msegment}) \times M_{resistance}$$

$$I_{density} = \frac{\text{avg}(I_{Msegment})}{M_{width}}$$

where $V_{Msegment}$ is the voltage drop across the wire segment, $I_{density}$ is the current density, and peak($I_{Msegment}$) and avg ($I_{Msegment}$) are respectively the peak and average currents passing though the wire segment. It is also contemplated that various formulas known in the art for estimating peak and average current can also be utilized by the present invention.

At steps 320–330, the simulation data is loaded and analyzed for current density and voltage drop violations within the power-bus grid. Preferably, the current density and voltage drop values are loaded from the SPICE simulation results. These values are then associated with the power-bus wire segments and graphically displayed to the user. For example, a color map is used to match ranges of current density and voltage drop values with wire segment colors. Each wire segment in the floor plan is displayed in the color matched to the value of the wire's current density or voltage drop. This way, the designer can visually inspect the floor plan design and easily find power-bus wire segments displayed in colors which indicate unacceptably high current density and voltage drop values. In addition, the designer can easily compare several floor plan designs and find the design with the best current density and voltage drop performance.

If the designer finds potential current density and voltage drop problems, he or she can return to the previous design system steps 302–318 and modify the design. For example, the designer may increase the width of power-bus wire segments containing a high current density. Conversely, wire segments with low current density and voltage drop values may be narrowed to allow additional room for various IC structures.

At step 332, the floor plan design is saved in a format compatible with layout tools. In this manner, the floor plan design can be incorporated with a IC design process flow. The designer may choose to modify the circuit abstraction or circuit netlist before implementing layout tools which will seed circuit structures within the power-bus grid design.

Figure 6:
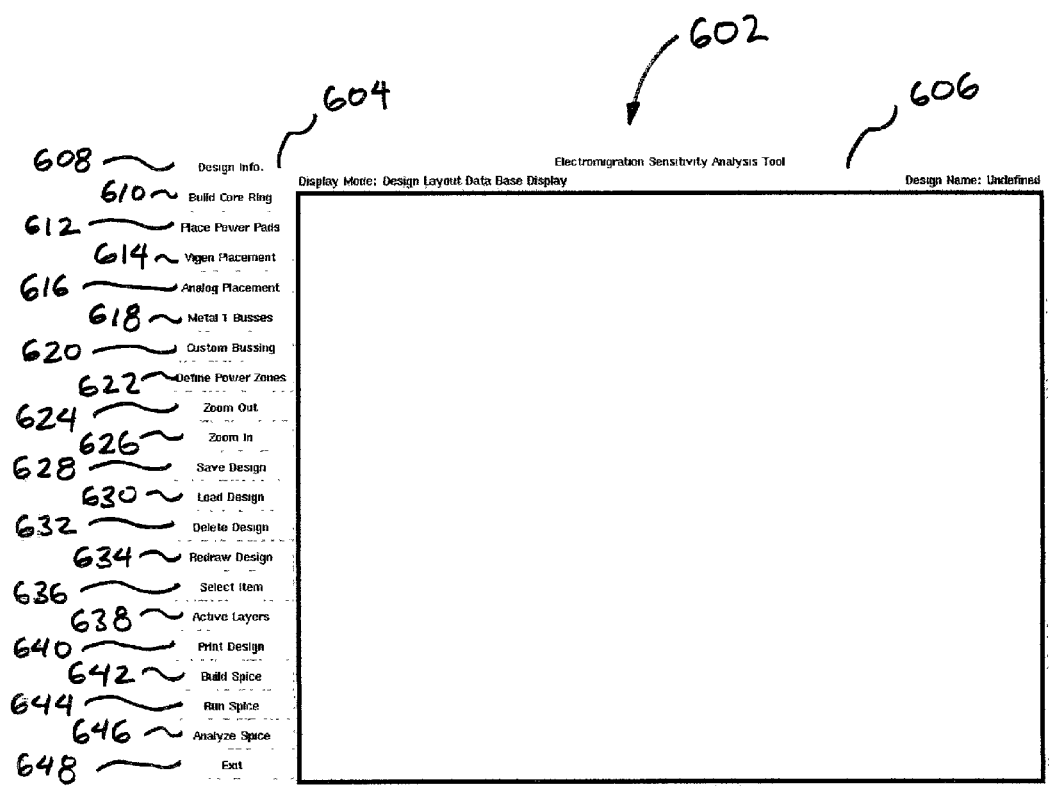
FIG. 6 show a user interface screen of an alternate embodiment of the present invention as a computer program.

An alternate embodiment of the present invention can be a computer program that may be performed on the general purpose computer shown in FIG. 1. FIG. 6 shows a user interface screen 602 of a computer program as contemplated by the present invention. The user interface screen 602 is preferably divided into a menu region 604 and a design region 606. The menu region 604 contains numerous buttons which allow the user to select various program options detailed below. The design region 606 is used to graphically create and analyze a floor plan design.

The Design Info. button 608 enables the designer to specify general floor plan design information. The Design Core Ring button 610 is used to create the initial power-bus grid ring. Power pads are mapped to the core with the Place Power Pads button 612. The Vigen Placement button 614 allows the user to specify power zones prohibiting Metal 1 lines from being seeded automatically within the zone. The Analog Placement button 616 creates an power zone containing analog circuit structures. The Metal 1 Busses button 618 seeds Metal 1 wires automatically throughout the core. The Custom Bussing button 620 allows the designer to selectively place or remove power-bus wire segments. The Define Power Zones button 622 maps power zones to specified locations on the core. The Zoom In and Zoom Out buttons 624 and 626 allow the user to increase and decrease the floor plan image respectively. The Save Design button 628 store the floor plan design in a computer file, and the Load Design button 630 retrieves stored floor plan designs. Floor plan designs are deleted using the Delete Design button 632. The Redraw Design button 634 refreshes the design region 606 view. The Select Item button 636 allows the user to select a particular floor plan design object. The Active Layers button 638 is used to selectively hide various metal bus layers from view. The Print Design button 640 generates a hard copy of the floor plan design. The Build Spice and Run Spice buttons 642 and 644 create and simulate the floor plan design. The Analyze Spice button 646 loads and displays power-bus wire grid current density and voltage drop values. The Exit button 648 terminates the program.

In FIG. 7, a design information dialog box is depicted. The user can specify the core size and supply voltage present on power pad cells in this dialog box. The dialog box is also used to choose a predetermined set of technology parameters or to create a custom design technology. FIG. 8 shows a custom design technology dialog box. Here the designer can specify the sheet resistance of the metal layers as well as pad cell dimensions. Preferably, each metal layer can be displayed in a different color, allowing the designer to differentiate segment layers in the design region screen.

Figure 10:
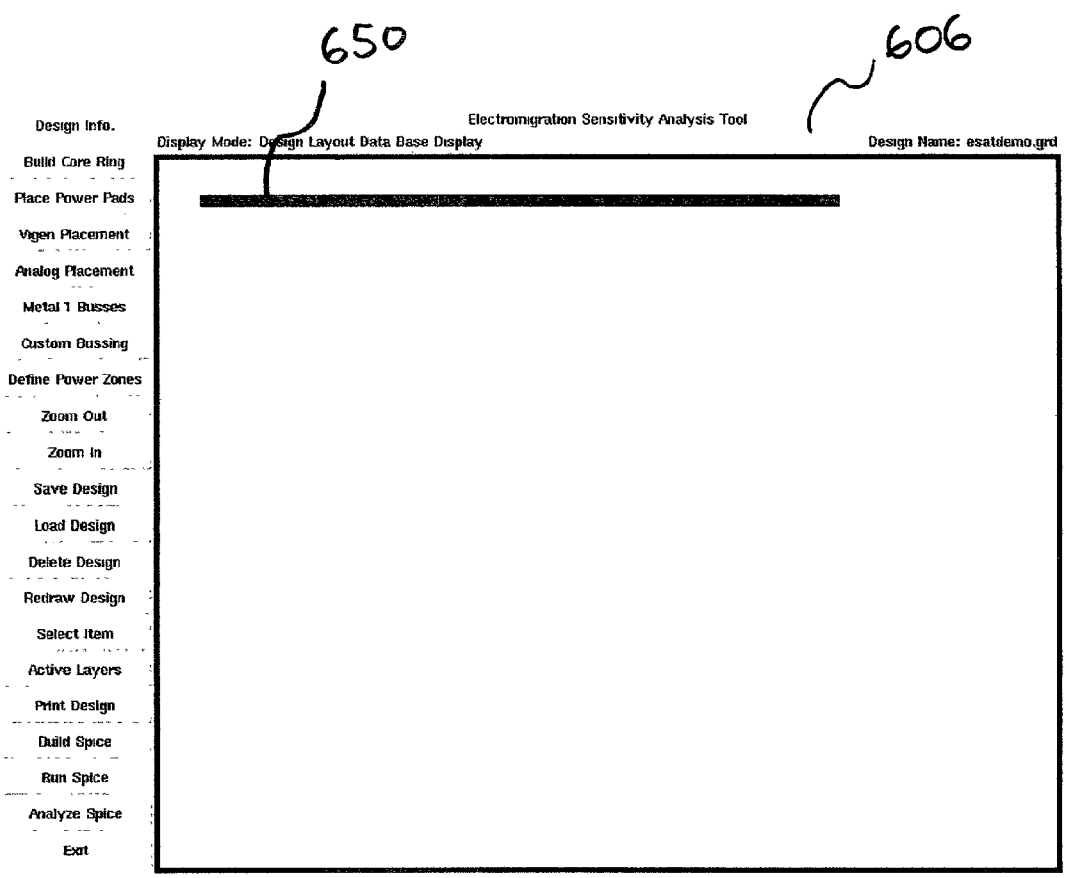
FIG. 10 shows the design region screen with a horizontal core ring wire segment as specified in the dialog box of FIG. 9.
Figure 11:
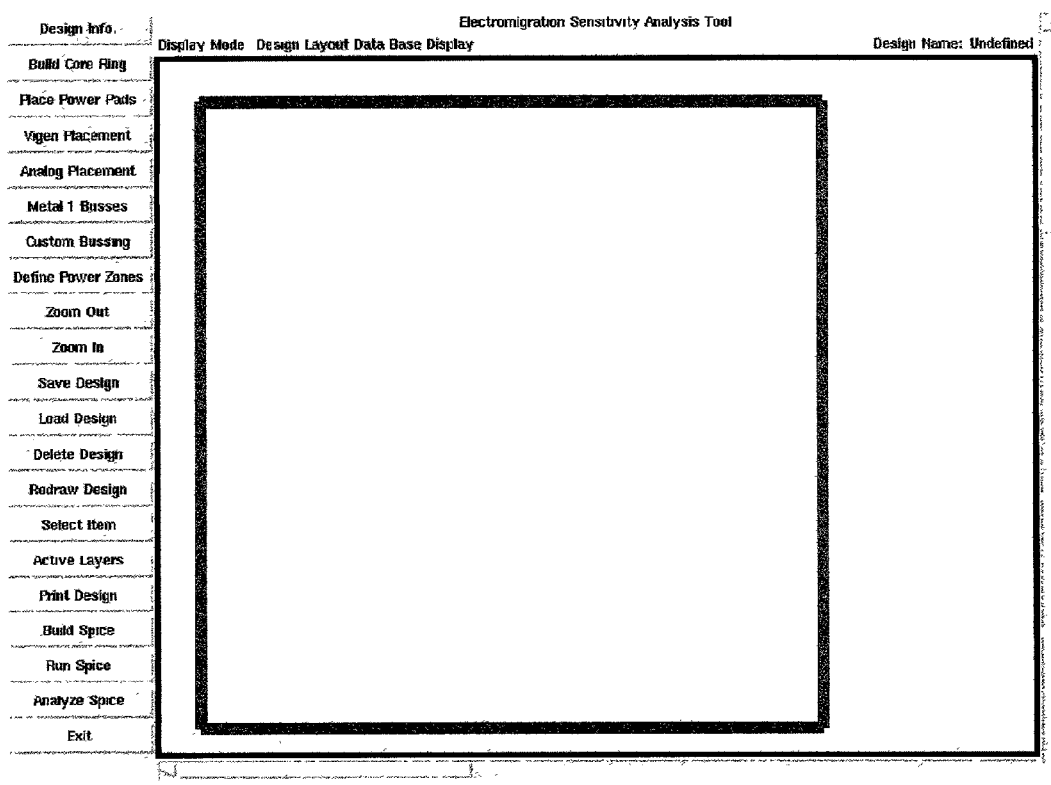
FIG. 11 shows the design region of FIG. 10 after additional core ring busses are placed on the core.

In FIG. 9, a core bus dialog box is shown. The core ring is created by placing vertical and horizontal core ring wire segments on several metal layers. The designer builds the core ring by specifying vertical and horizontal wire segments with the dialog box. FIG. 10 shows the design region 606 with a 75 um wide horizontal core ring wire segment 650 on Metal 3 centered at y-coordinate 0 um, as specified in the dialog box of FIG. 9. The wire starts at x-coordinate 0 um and stops at x-coordinate 4000 um. FIG. 11 shows the design region of FIG. 10 after additional core ring busses are placed on the core. The designer can determine the metal layer of each wire segment by its color. For example, busses running vertically are placed on Metal 2 and are colored red, and the horizontally-running Metal 3 busses are colored blue.

Figure 13:
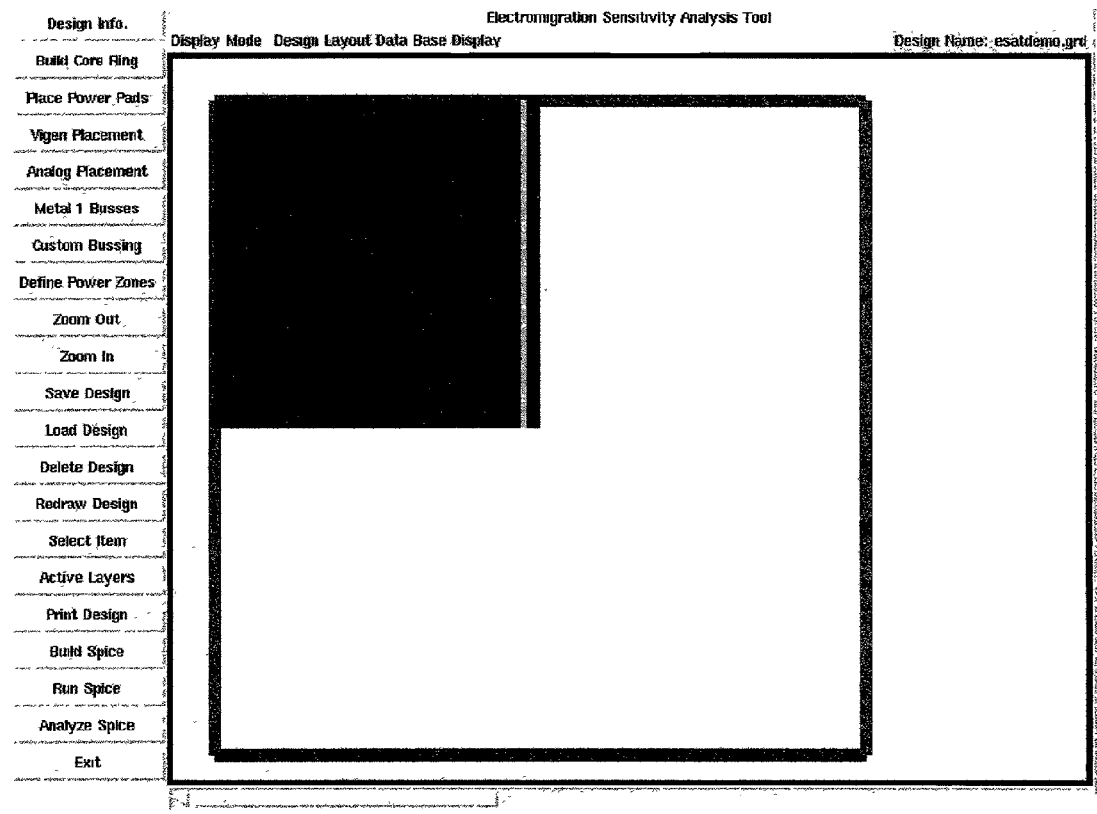
FIG. 13 shows the floor plan design of FIG. 11 with a Vigen power zone added.

FIG. 12 shows a Vigen power zone dialog box. The Vigen power zone dialog box allows the designer to define power zone locations which preclude Metal 1 bus lines from passing through. Generally, Vigen power zones contain memory structures and prevent Metal 1 busses from being seeded within the power zone. The Vigen power zone dialog box allows the user to specify the zone's current consumption, physical dimensions, and an internal power bus. For electromigration analysis, the block's average current consumption is entered, while voltage drop analysis requires the block's peak current consumption to be entered. FIG. 13 shows the floor plan design of FIG. 11 with a Vigen power zone added at the top left corner. The power zone is vertically oriented, centered about the an x-coordinate of 2000 um, and has a 2000 um length and a 2000 um width. Any number of Vigen power zones can be added or removed using the Vigen dialog box.

Figure 14:
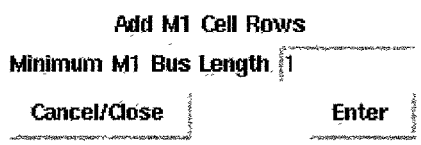
FIG. 14 shows a Metal 1 placement dialog box.
Figure 15:
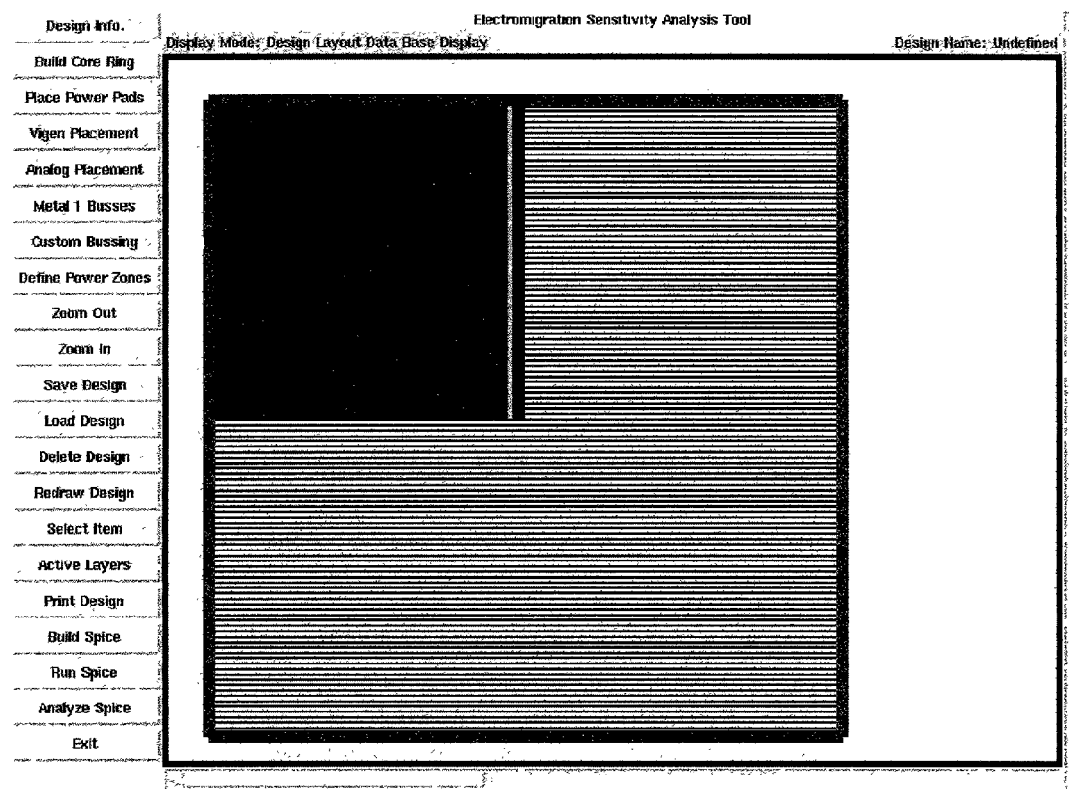
FIG. 15 shows the placement of the Metal 1 rows in the floor plan design of FIG. 13.

At FIG. 14, a Metal 1 placement dialog box is shown. This dialog box allows the user to seed Metal 1 wires into the floor plan automatically. As mentioned, the Vigen power zones prevent Metal 1 wires from being seeded in their locations. The minimum cell row length allows the designer to control the minimum length of Metal 1 cell rows. The placement of the Metal 1 rows in the floor plan design of FIG. 13 is shown in FIG. 15. The Metal 1 wires are represented by black horizontal lines.

Figure 16:
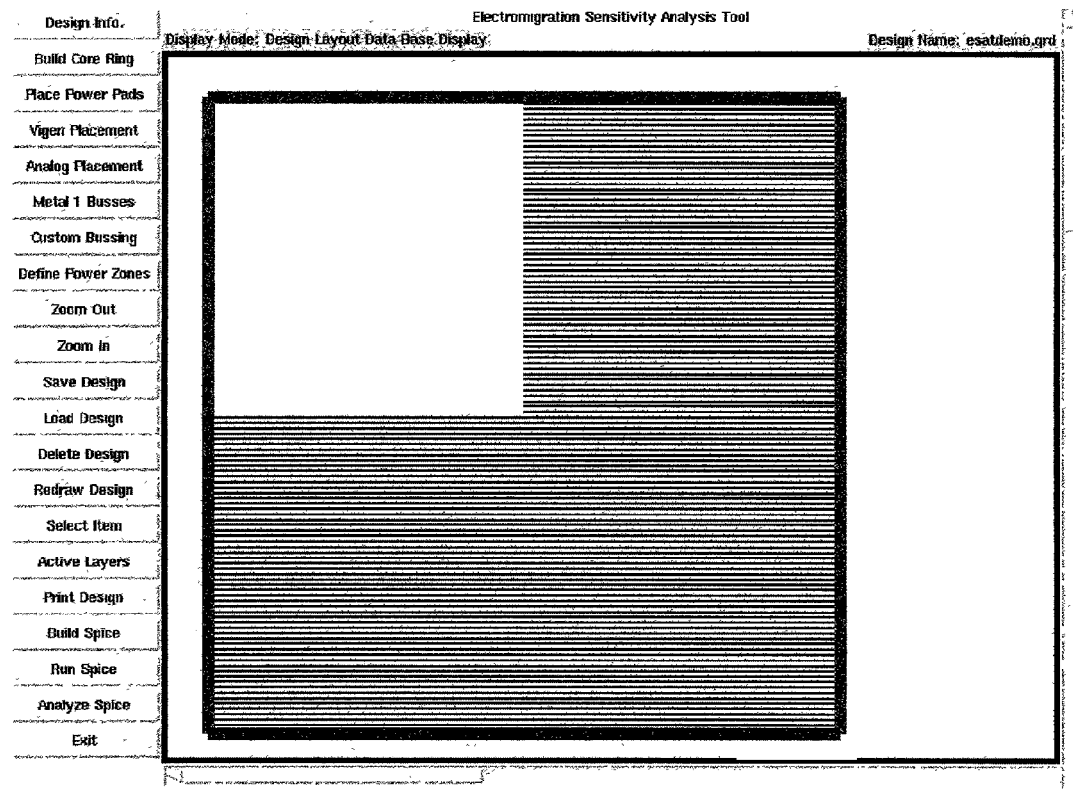
FIG. 16 shows the floor plan design of FIG. 15 after a Vigen power zone is deleted.

At any time during the floor plan creation, design elements can be modified or deleted. For example, in FIG. 16, the floor plan design of FIG. 15 is shown with a Vigen power zone deleted from the core. As shown in the figure, Metal 1 lines do not extend within the deleted Vigen power zone area.

Figure 17:
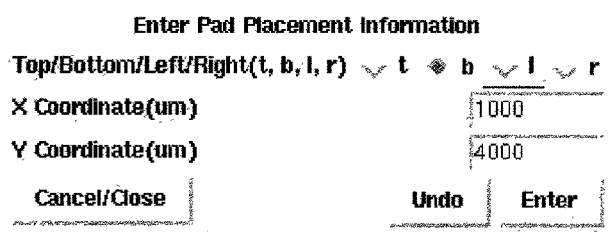
FIG. 17 shows a power pad cell dialog box.
Figure 18:
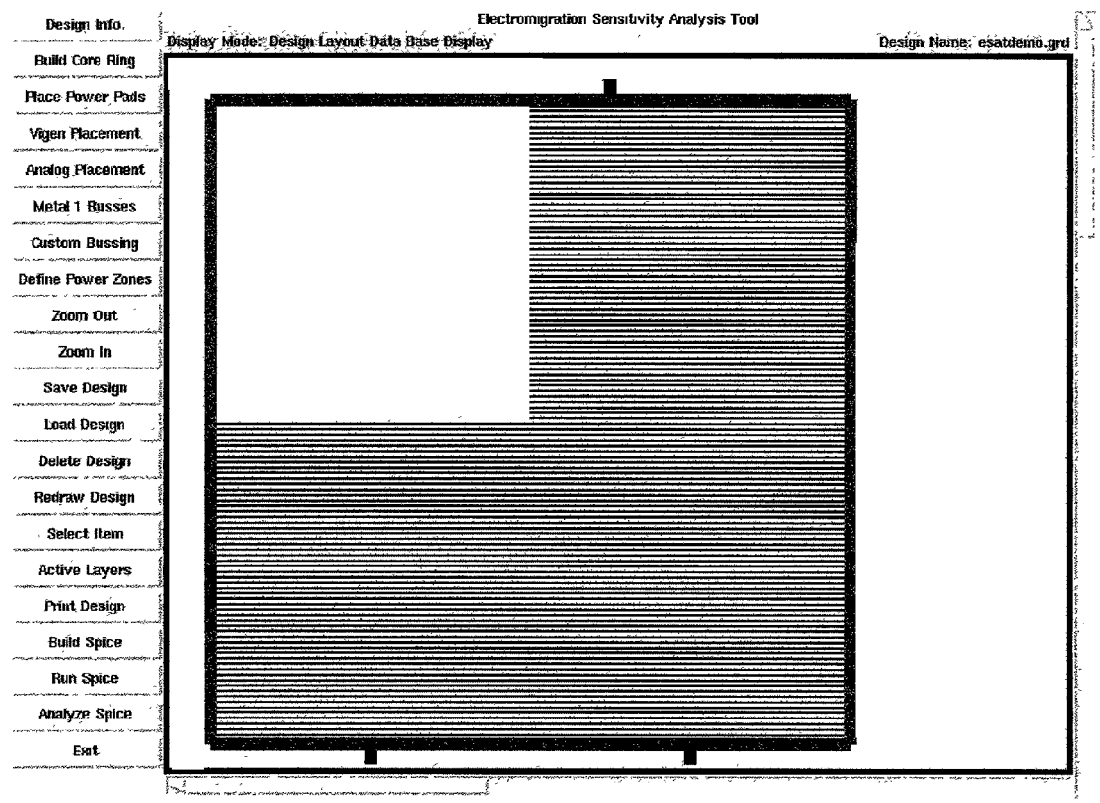
FIG. 18 shows several pad cells placed in the floor plan design of FIG. 16.

At FIG. 17, a power pad cell dialog box is shown. The user enters the pad cell coordinates and orientation (top, bottom, left, or right). Pad cells can be placed anywhere on the silicon core and any number of pads can be created or removed. FIG. 18 shows several pad cells placed in the floor plan of FIG. 16.

Figure 19:
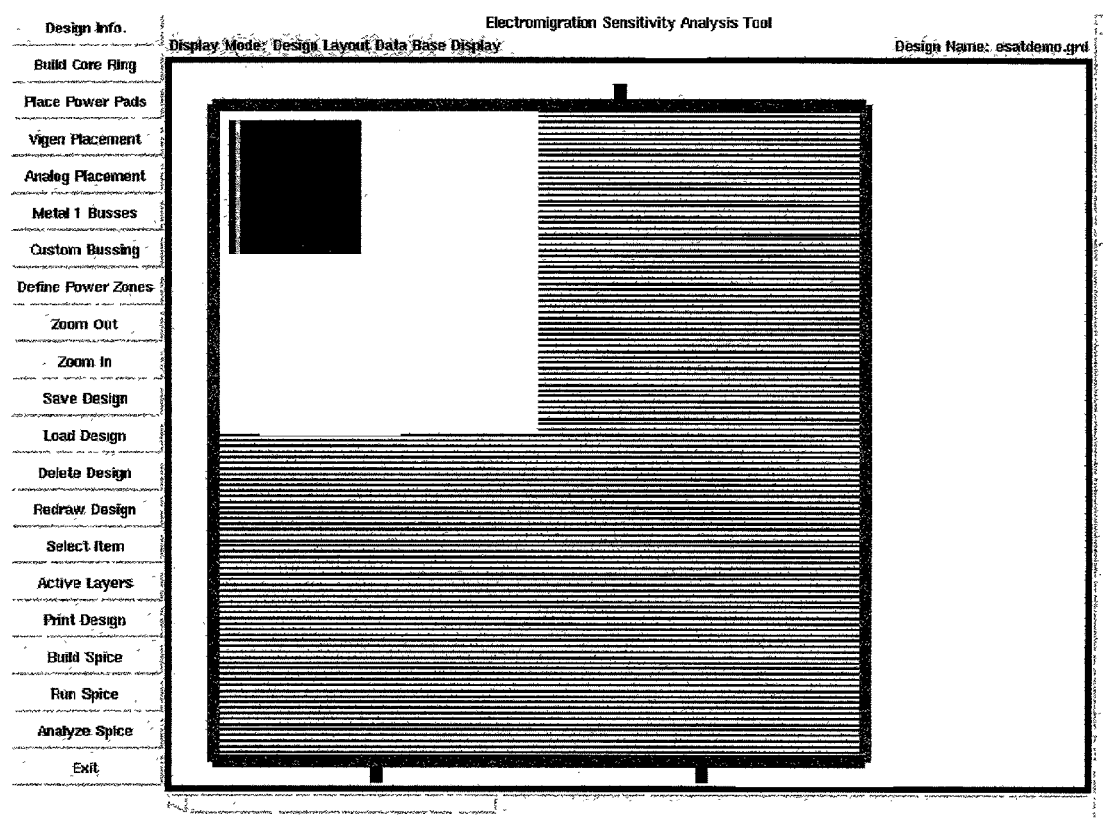
FIGS. 19 and 20 show additional Vigen power zones added to the floor plan design of FIG. 18.
Figure 20:
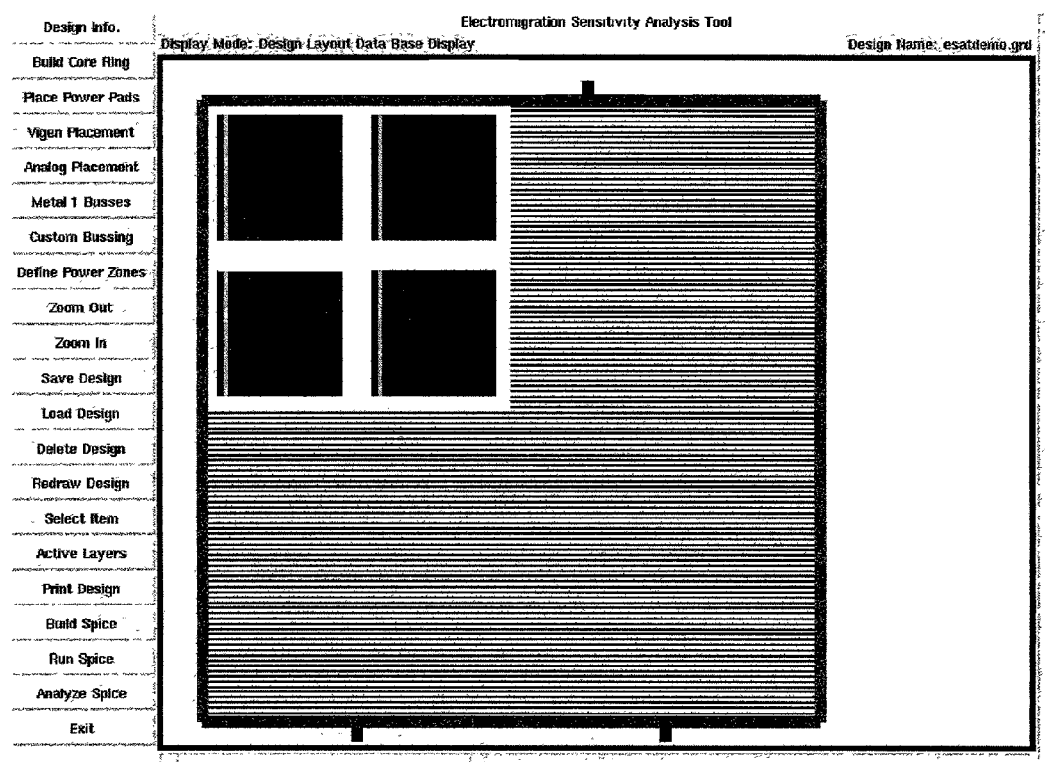

FIGS. 19 and 20 show additional Vigen power zones added to the floor plan of FIG. 18. Each power zone is 800 um wide and 800 um long. A 20 um wide power-bus wire is specified to run vertically across each of the power zones.

Figures 21, 22:
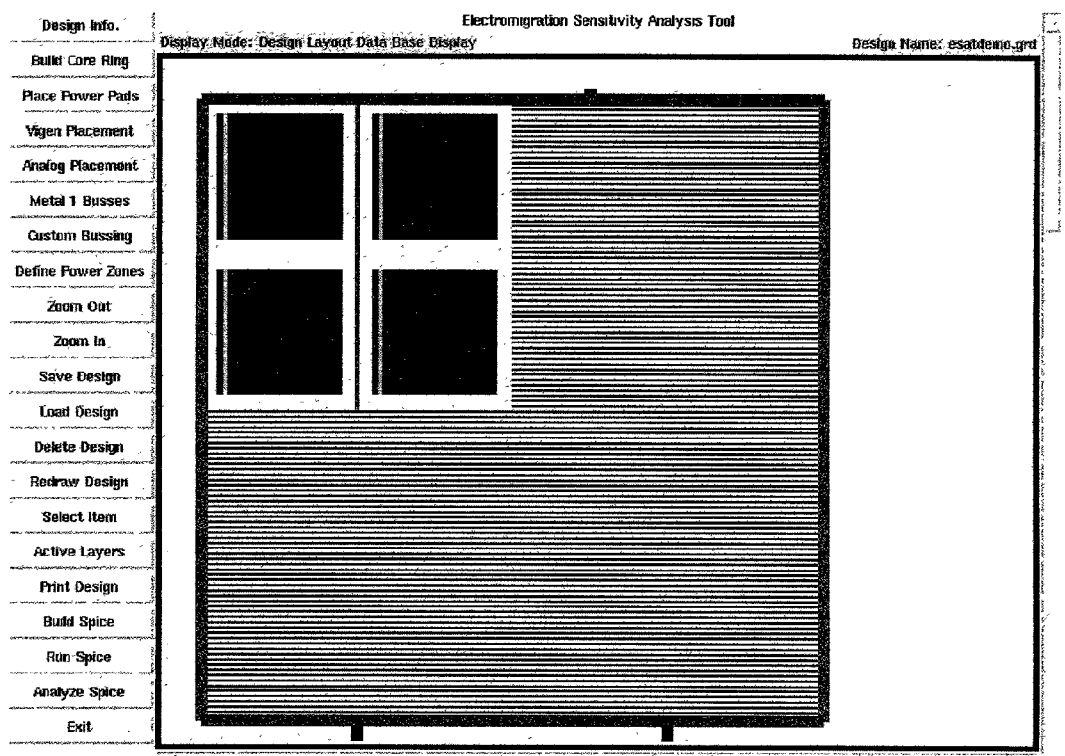
FIG. 21 shows a custom power-bus dialog box.
FIG. 22 shows a custom wire segment placed in the upper left corner of the floor plan design of FIG. 20.
Figures 23, 24:
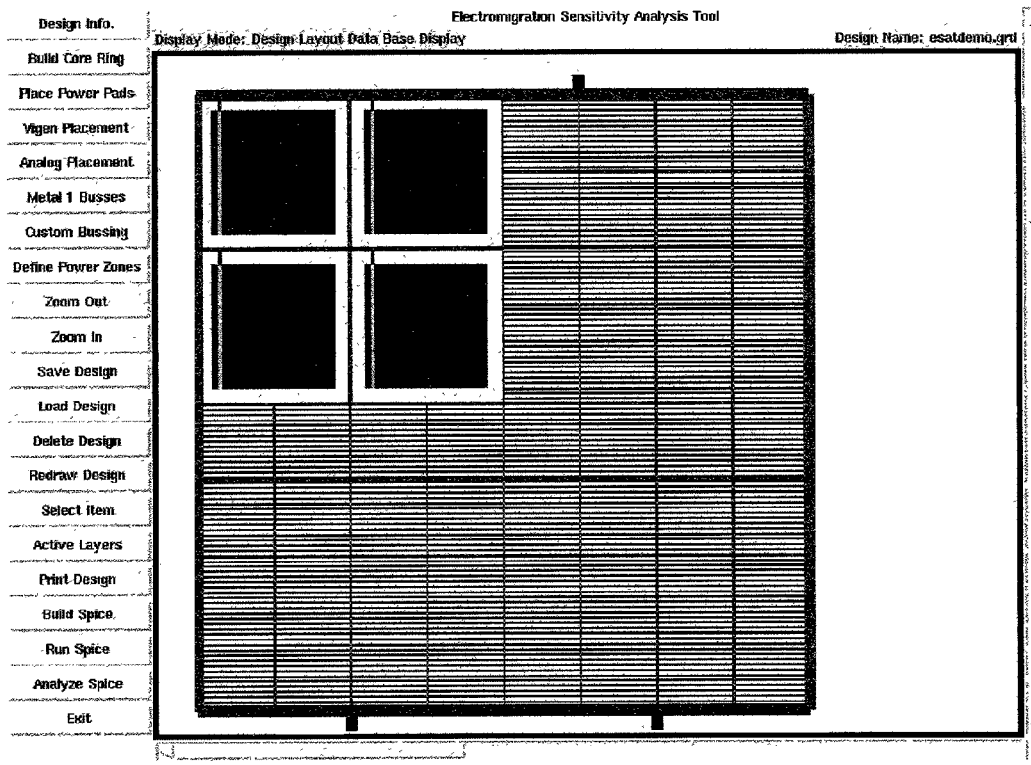
FIG. 23 shows additional custom wire segments added to the power-bus grid of FIG. 22.
FIG. 24 shows a power zone information dialog box for mapping regions of the core bus which consume current.

At FIG. 21, a custom power-bus dialog box is shown. The designer uses the custom power-bus dialog box to map individual power-bus wire segments to a floor plan design. The metal layer, orientation, width, and placement of the wire segment is entered by the user. FIG. 22 shows a custom wire segment placed in the upper left corner of the FIG. 20 floor plan design. The wire is mapped to the Metal 2 layer and is vertically oriented, and centered at x-coordinate 1000 um. In FIG. 23, additional custom wire segments are added to the power-bus grid of FIG. 22.

Figure 25:
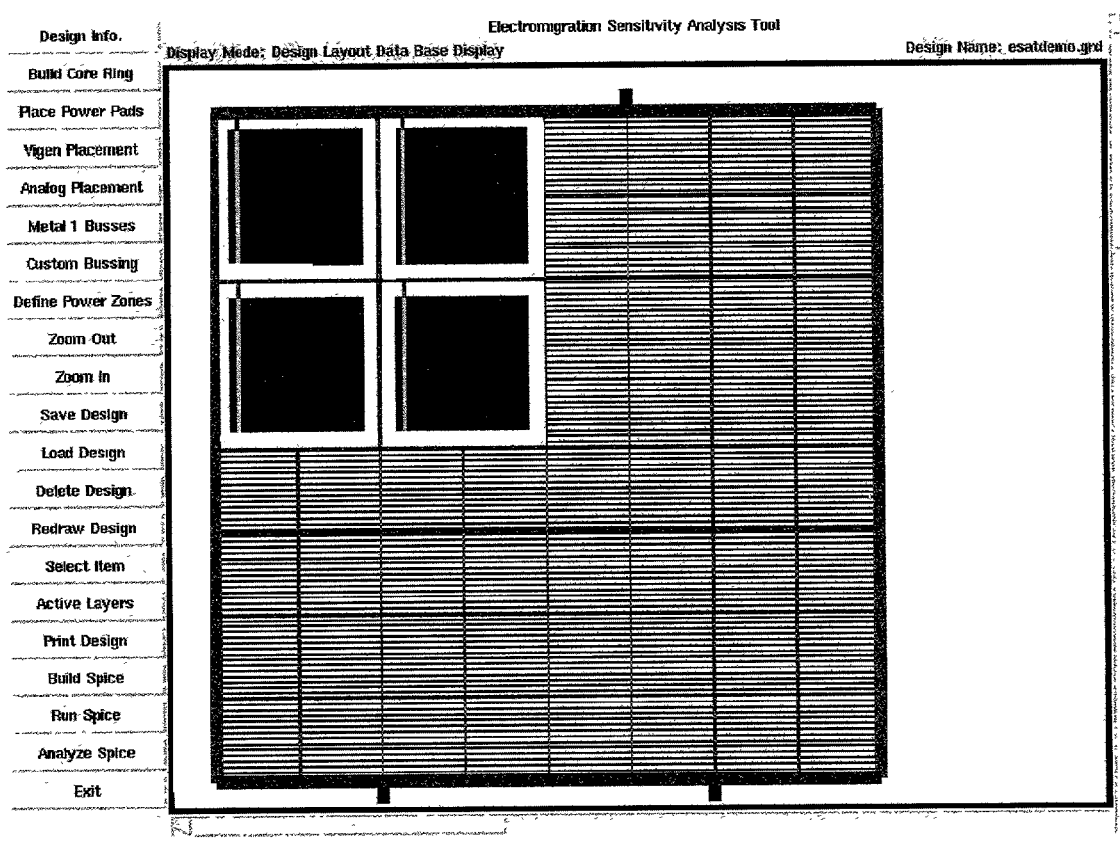
FIG. 25 shows a vertically oriented power zone added to the floor plan design of FIG. 23.
Figure 26:
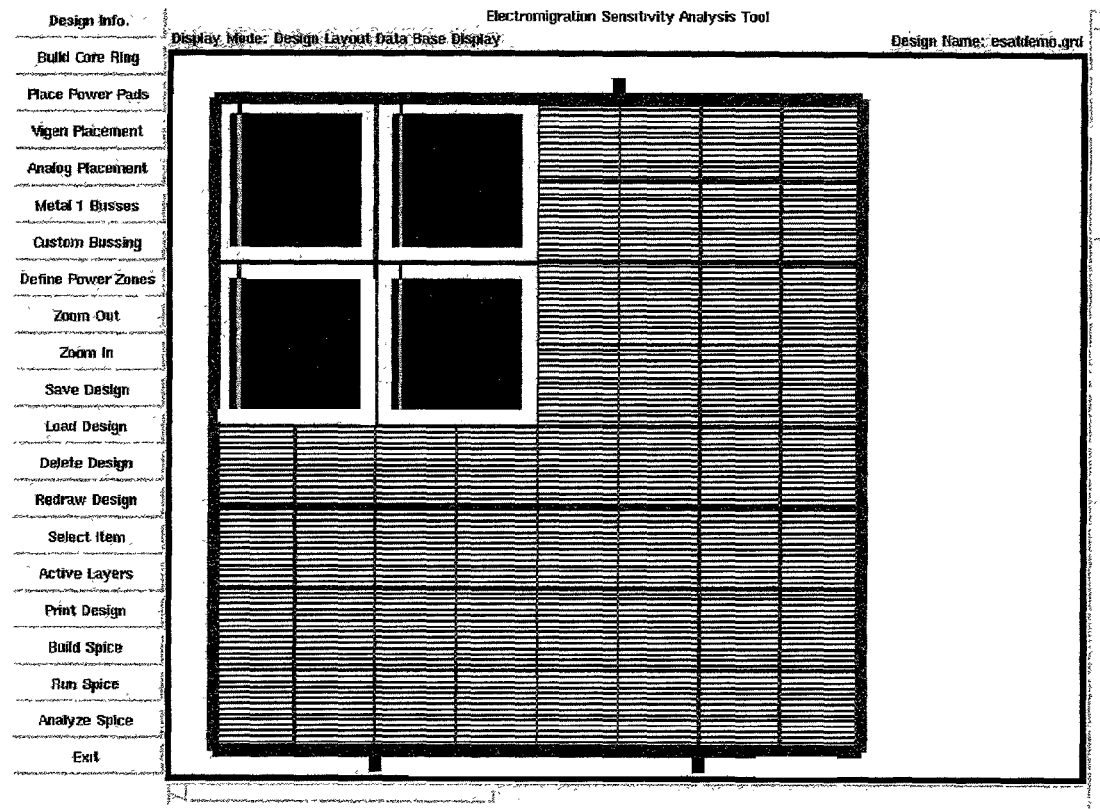
FIG. 26 shows addition power zones added to the floor plan design of FIG. 25.

FIG. 24 shows a power zone information dialog box for mapping regions of the core bus which consume current. As earlier stated, average current consumption is specified for electromigration analysis, and peak current consumption is entered for voltage drop analysis. In this manner, the designer can skew the power on the core to certain analog and digital blocks that are known to consume more power than other portions of the floor plan design. In FIG. 25, a vertically oriented power zone with a width of 2000 um and centered about the x-coordinate at 1000 um is added to the floor plan design of FIG. 23, shown in yellow. The power zone starts at y-coordinate 2000 um and stops at y-coordinate 4000 um, and consumes 130 mA of current. In FIG. 26, the addition power zones are added to the floor plan design of FIG. 25.

Figure 27:
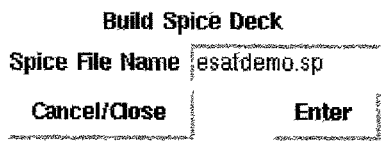
FIG. 27 shows a build SPICE deck dialog box.

In FIGS. 27 and 28, dialog boxes are shown which allow a netlist of a floor plan design to be created and simulated. The netlist created is a resistor mesh circuit of the power-bus grid, with current sources placed at the intersections of Metal 1 and Metal 2 bus wires. The user can specify the file names of the netlist file created and SPICE simulation output file created.

Figure 30:
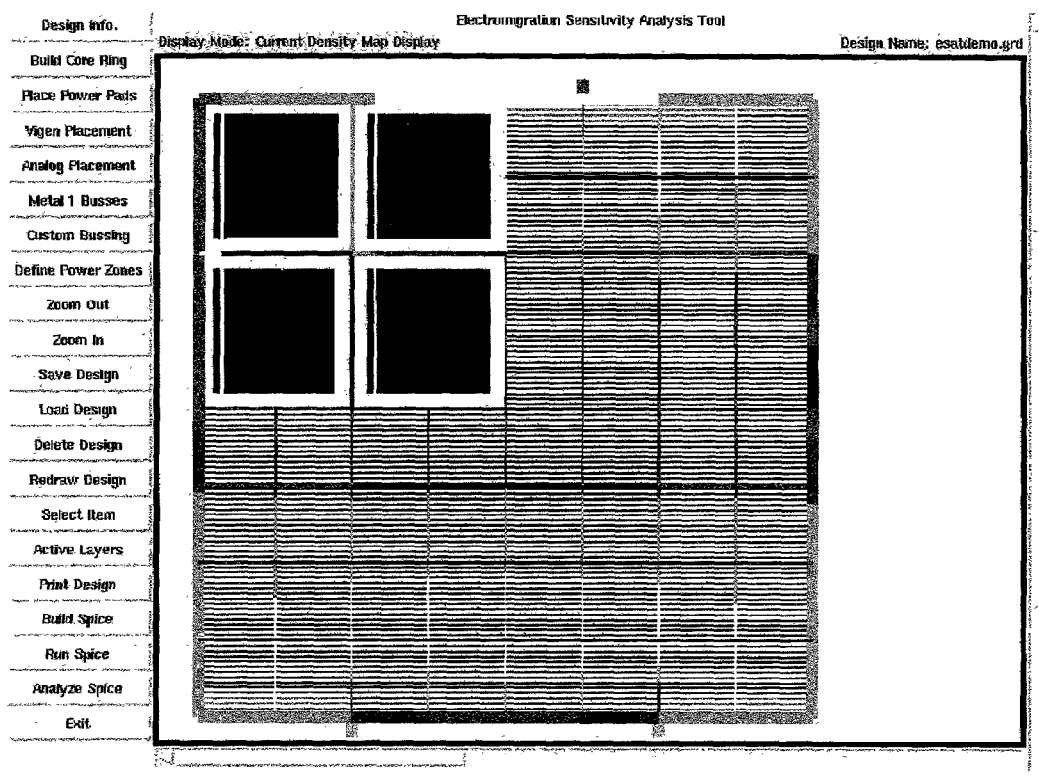
FIG. 30 shows the power-bus grid of FIG. 26 color coded with current density levels.
Figure 31:
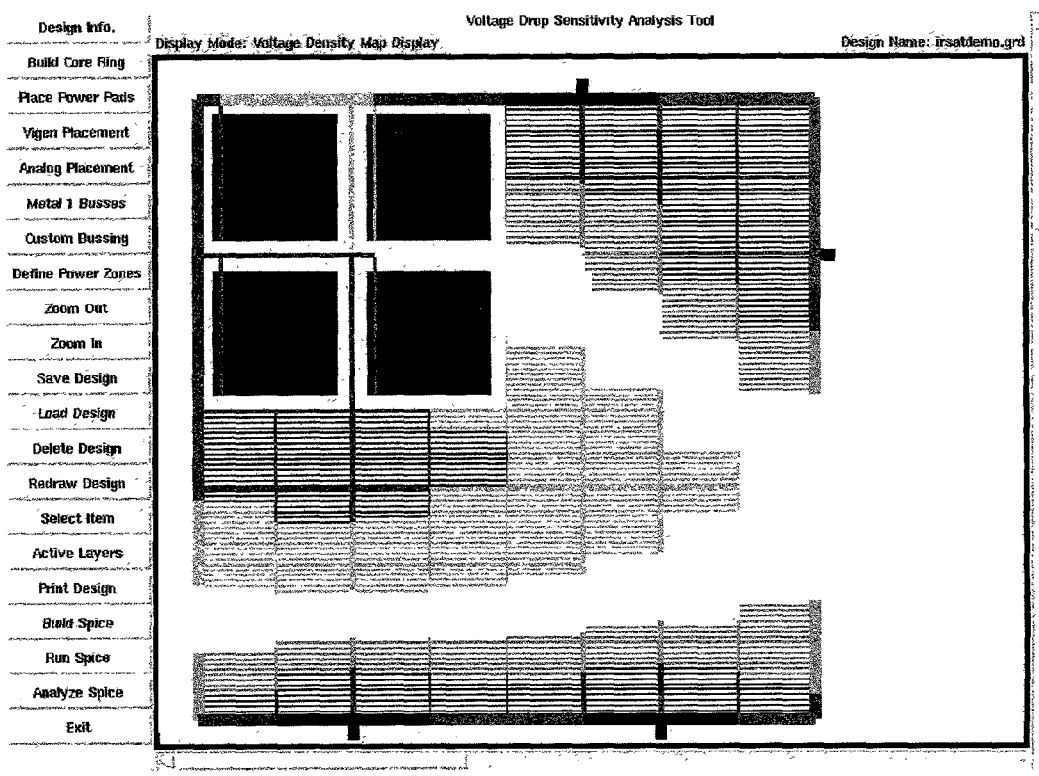
FIG. 31 shows a power-bus grid color coded with voltage drop levels.

Once the SPICE simulation is completed, the output is analyzed for either electromigration problems or voltage drop problems. FIG. 29 shows a dialog box for loading the SPICE simulation output results. The software extracts current density and voltage drop information from the SPICE output listing, and this information is internally cross referenced to the power-bus grid wire segments. FIG. 30 shows the power-bus grid of FIG. 26 color coded with current density levels. FIG. 31 shows a power-bus grid that is color coded with voltage drop levels. By examining the color of power-bus wire segments, the designer can quickly determine where potential electromigration or voltage drop problems are likely to occur in the power-bus grid. For example, in FIG. 31, red colored wire segments in the floor plan design section indicate high voltage drop levels. Thus, the designer can modify the floor plan design to reduce the voltage drop across the red colored wire segments.

To help the user analyze the power-grid design, various metal layers, power zones, and pad cells can be either displayed or hidden. In FIG. 32, the activate layers dialog box is show. The user can turn power-bus grid elements on and off using this dialog box. In addition, the user can set the range values for the current density and voltage drop color map. FIG. 33 shows the set color map dialog box for electromigration range values, and FIG. 34 shows the dialog box for voltage drop range values. With these dialog boxes, the designer can set new color threshold levels for each color shown on the screen design region screen to get a better idea of the magnitude of the current density and voltage drop on any bus of interest.

Figure 35:
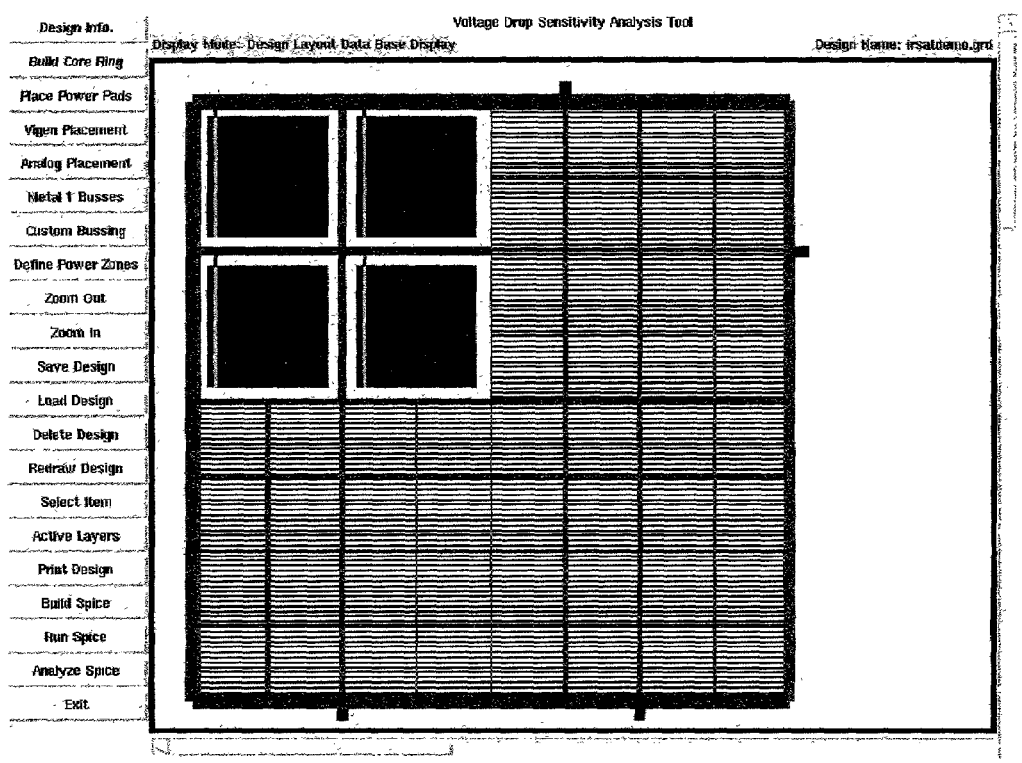
FIG. 35 shows the power-bus grid of FIG. 31 modified to achieve better voltage drop performance.
Figure 36:
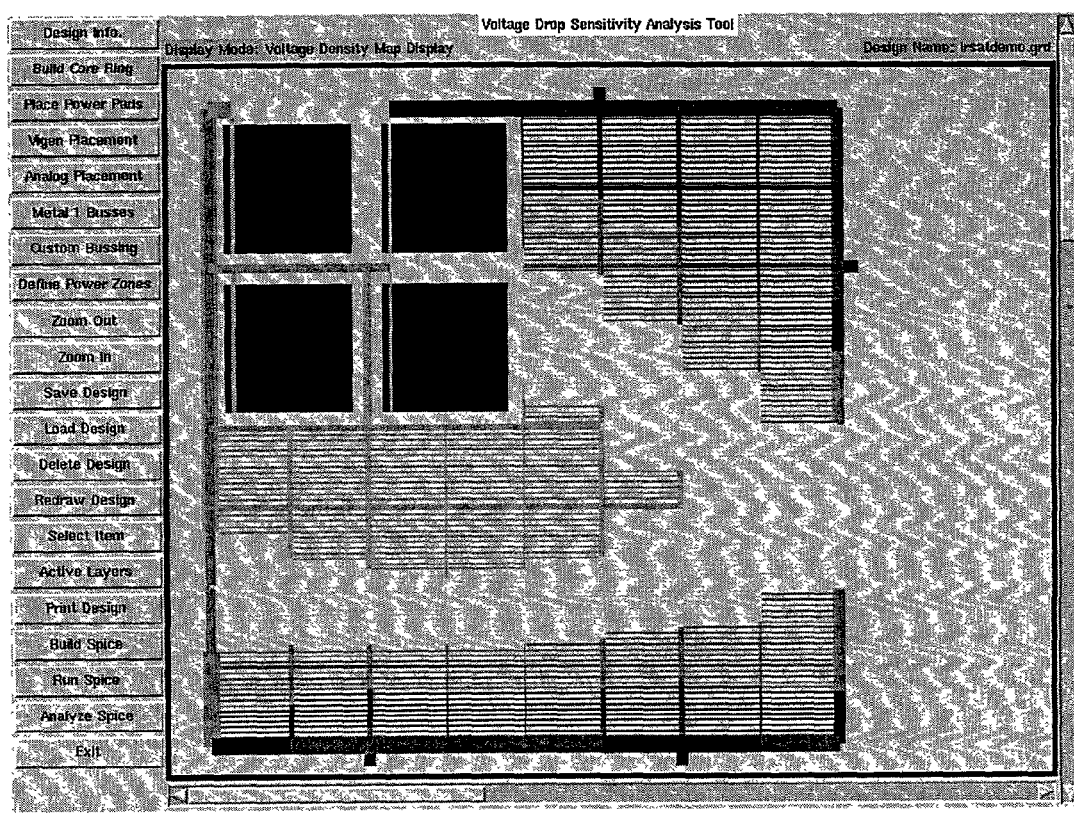
FIG. 36 shows a resulting voltage drop simulation performed on the modified floor plan of FIG. 35.

In FIG. 35, the power-bus grid of FIG. 31 is modified to achieve better voltage drop performance. The top, left, and bottom busses on the core ring are made larger. An additional Metal 3 power bus is placed on top of the original left hand side Metal 2 core ring bus. The size of the power bus segments between the memory cells is also increased. After all the modifications are made, the design is once again simulated and analyzed. FIG. 36 shows the resulting voltage drop simulation performed on the modified floor plan. As shown, the voltage drop across the previously red colored wire segments is reduced by the floor plan design modifications.

The program can save the floor plan design in a format compatible with layout tools. This file can then be used to route and place the floor plan with the rest of the circuit design.

The design tool of the present invention can therefore assist layout design engineers in optimizing power-bus grid designs of an IC such that the risk of electromigration and voltage drop is minimized without sacrificing excessive die size. Designers can quickly and easily analyze power-bus grid designs before a detailed simulation of the IC layout is made. This can reduce the IC's time-to-market, and help create a more competitive product. The present invention can help engineers perform "what if" analysis on a floor plan design and improve an IC power-bus grid's performance. The invention can also be used to predict and model power-bus grid designs for new fabrication technologies. Additionally, several power-bus grid designs can be compared to one another quickly using the present invention.

While the invention has been particularly shown and described with reference to a preferred embodiment thereof, it will be understood by those skilled in the art that various other changes in the form and details may be made without departing from the spirit and scope of the invention.

The invention claimed is:

1. A method for analyzing current density in wire segments forming a power-bus grid in an integrated circuit core, the method comprising:
   mapping the power-bus grid to the integrated circuit core, wherein said mapping comprises accepting design information of said integrated circuit core entered in response to a prompt;
   accepting information for at least one power zone in the integrated circuit core;
   calculating a current density in the wire segments with respect to the power zone; and
   displaying the calculated current density in the wire segments, wherein accepting information for at least one power zone comprises prohibiting wire segments in a metal layer of at least one of said at least one power zone.

2. A method as defined in claim 1, wherein the operation of calculating a current density further includes:
   generating an equivalent circuit of the wire segments and the power zone;
   simulating the equivalent circuit; and
   generating a representation of the current density of the equivalent circuit.

3. A method as defined in claim 2, wherein the equivalent circuit comprises a netlist.

4. A method as defined in claim 1, wherein the operation of displaying a current density further includes:
   defining one or more current density threshold values; and
   indicating when the current density exceeds the one or more threshold values.

5. A method as defined in claim 4, wherein the operation of indicating when the current density exceeds the one or more threshold values further includes:
   matching each of the one or more threshold values with a corresponding color; and
   displaying the power-bus grid in the colors matched to the threshold values.

6. A method as defined in claim 1, wherein the operation of mapping the power-bus grid further includes accepting a length and a width of the integrated circuit core.

7. A method as defined in claim 1, wherein the operation of mapping the power-bus grid further includes accepting a length and a width of the wire segments.

8. A method as defined in claim 1, wherein the operation of mapping the power-bus grid further includes accepting a vertical layer for the wire segments.

9. A method as defined in claim 1, wherein the operation of mapping the power-bus grid includes accepting a metal layer sheet resistance of the wire segments.

10. A method as defined in claim 1, wherein the power zone includes at least one of a memory block, a digital block, an analog block, and a pad cell block.

11. A method as defined in claim 1, wherein the operation of mapping the power-bus grid further includes mapping at least one power pad cell on the core.

12. A method as defined in claim 11, further comprising accepting a value for a power supply voltage at the power pad cell.

13. A method as defined in claim 12, further comprising accepting a length and a width of the power pad cell.

14. A method as defined in claim 1, further comprising:
   abstracting a circuit design receiving power from the power-bus grid; and
   generating a netlist of the circuit design.

15. A method as defined in claim 14, wherein the operation of generating a netlist of the circuit design is completed after the operation of displaying the calculated electrical characteristic in the wire segments.

16. A method for analyzing voltage drop in wire segments forming a power-bus grid in an integrated circuit core, the method comprising:
   mapping the power-bus grid to the integrated circuit core, wherein said mapping comprises accepting design information of said integrated circuit core entered in response to a prompt;
   accepting information for at least one power zone in the integrated circuit core;
   calculating a voltage drop in the wire segments with respect to the power zone; and
   displaying the calculated voltage drop in the wire segments, wherein accepting information for at least one power zone comprises prohibiting wire segments in a metal layer of at least one of said at least one power zone.

17. A method as defined in claim 16, wherein the operation of calculating a voltage drop further includes:
   generating an equivalent circuit of the wire segments and the power zone;
   simulating the equivalent circuit; and
   generating a representation of the voltage drop of the equivalent circuit.

18. A method as defined in claim 17, wherein the equivalent circuit comprises a netlist.

19. A method as defined in claim 16, wherein the operation of displaying a voltage drop further includes:
   defining one or more voltage drop threshold values; and
   indicating when the voltage drop exceeds the one or more voltage drop threshold values.

20. A method as defined in claim 19, wherein the operation of indicating when the voltage drop exceeds the one or more voltage drop threshold values further includes:
   matching each of the one or more voltage drop threshold values with a corresponding color; and
   displaying the power-bus grid in the colors matched to the one or more voltage drop threshold values.

21. A method as defined in claim 16, wherein the operation of mapping the power-bus grid includes accepting a length and a width of the integrated circuit core.

22. A method as defined in claim 16, wherein the operation of mapping the power-bus grid further includes accepting a length and a width of the wire segments.

23. A method as defined in claim 16, wherein the operation of mapping the power-bus grid further includes accepting a vertical layer for the wire segments.

24. A method as defined in claim 16, wherein the operation of mapping the power-bus grid includes accepting a metal layer sheet resistance of the wire segments.

25. A method as defined in claim 16, wherein the power zone includes at least one of a memory block, a digital block, an analog block, and a pad cell block.

26. A method as defined in claim 16, wherein the operation of mapping the power-bus grid further includes mapping at least one power pad cell on the core.

27. A method as defined in claim 26, further comprising accepting information for a power supply voltage at the power pad cell.

28. A method as defined in claim 27, further comprising accepting a length and a width of the power pad cell.

29. A method as defined in claim 16, further comprising:
abstracting a circuit design receiving power from the power-bus grid; and
generating a netlist of the circuit design.

30. A method as defined in claim 29, wherein the operation of generating a netlist of the circuit design is completed after the operation of displaying the calculated electrical characteristic in the wire segments.

31. A method for analyzing an electrical characteristic of wire segments forming a power-bus grid in an integrated circuit core, the method comprising:
mapping the power-bus grid to the integrated circuit core, wherein said mapping comprises accepting design information of said integrated circuit core entered in response to a prompt;
accepting information for at least one power zone in the integrated circuit core;
calculating an electrical characteristic of the wire segments relating to the current flowing there through; and
displaying the calculated electrical characteristic in the wire segments, wherein the operation of accepting design information of said integrated circuit core comprises choosing one of (i) a first mode configured to select a predetermined set of technology parameters in response to a user input and (ii) a second mode configured to generate custom design technology parameters in response to said user input.

32. A method for analyzing an electrical characteristic of wire segments forming a power-bus grid in an integrated circuit core, the method comprising:
mapping the power-bus grid to the integrated circuit core, wherein said mapping comprises accepting design information of said integrated circuit core entered in response to a prompt;
accepting information for at least one power zone in the integrated circuit core;
calculating an electrical characteristic of the wire segments relating to the current flowing there through; and
displaying the calculated electrical characteristic in the wire segments, wherein accepting information for at least one power zone comprises prohibiting wire segments in a metal layer of at least one of said at least one power zone.

33. The method according to claim 32, further comprising:
modifying either or both of said design information and said power zone information to generate a plurality of power-bus grid designs; and
comparing said plurality of power-bus grid designs.

34. The method of claim 32, further comprising:
mapping one or more circuit structures to said integrated circuit core based on said power-bus grid.

35. The method of claim 32, wherein said design information includes at least one of a fabrication technology, a power supply voltage, power pad cell dimensions, power pad placement information, core bus information, custom bus information and a metal layer sheet resistance.

36. The method of claim 32, wherein said mapping further comprises accepting one or more of a length, a width, an orientation, and a metal layer for at least one of said wire segments.

37. The method of claim 32, wherein accepting information for said at least one power zone comprises one or both of entering an average current consumption and entering a peak current consumption.

38. A method as defined in claim 32, wherein the calculated electrical characteristic of the wire segments is a calculated current density of the wire segments.

39. A method as defined in claim 32, wherein the calculated electrical characteristic of the wire segments is a calculated voltage drop of the wire segments.

40. A method as defined in claim 32, further comprising:
abstracting a circuit design receiving power from the power-bus grid; and
generating a netlist of the circuit design.

41. A method as defined in claim 40, wherein the operation of generating a netlist of the circuit design is completed after the operation of displaying the calculated electrical characteristic in the wire segments.

* * * * *